(12) United States Patent
Takano et al.

(10) Patent No.: US 11,581,870 B2
(45) Date of Patent: Feb. 14, 2023

(54) STACKED ACOUSTIC WAVE RESONATOR PACKAGE WITH LASER-DRILLED VIAS

(71) Applicant: Skyworks Solutions, Inc., Irvine, CA (US)

(72) Inventors: Atsushi Takano, Kadoma (JP); Mitsuhiro Furukawa, Nishinomiya (JP); Takeshi Furusawa, Toyonaka (JP)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 158 days.

(21) Appl. No.: 17/034,810

(22) Filed: Sep. 28, 2020

(65) Prior Publication Data

US 2021/0099157 A1   Apr. 1, 2021

Related U.S. Application Data

(60) Provisional application No. 62/907,255, filed on Sep. 27, 2019, provisional application No. 62/907,264, filed on Sep. 27, 2019, provisional application No. 62/907,290, filed on Sep. 27, 2019, provisional application No. 62/907,329, filed on Sep. 27, 2019.

(51) Int. Cl.
| | |
|---|---|
| *H03H 9/25* | (2006.01) |
| *H03H 9/02* | (2006.01) |
| *H03H 9/64* | (2006.01) |
| *H03H 3/08* | (2006.01) |
| *H03H 9/145* | (2006.01) |

(52) U.S. Cl.
CPC ............... *H03H 9/25* (2013.01); *H03H 3/08* (2013.01); *H03H 9/02574* (2013.01); *H03H 9/145* (2013.01); *H03H 9/6406* (2013.01)

(58) Field of Classification Search
CPC ............ H03H 9/145; H03H 9/25; H03H 9/05; H03H 9/64
See application file for complete search history.

(56) References Cited

U.S. PATENT DOCUMENTS 7,545,017 B2   6/2009  Lee et al.
8,067,879 B2 * 11/2011  Kudo .................... H03H 9/1092
                                                          310/313 R
(Continued)

*Primary Examiner* — Samuel S Outten
*Assistant Examiner* — Alan Wong
(74) *Attorney, Agent, or Firm* — Knobbe, Martens, Olson & Bear LLP

(57) ABSTRACT

A packaged acoustic wave component is disclosed. The packaged acoustic wave component can include a first acoustic wave resonator that includes a first interdigital transducer electrode that is positioned over a first piezoelectric layer. The packaged acoustic wave component can also include a second acoustic wave resonator including a second interdigital transducer electrode positioned over a second piezoelectric layer. The second piezoelectric layer is bonded to the first piezoelectric layer. The packaged acoustic wave component can further include a stopper structure that is positioned over the first piezoelectric layer. The first stopper structure is positioned above a via and extends through the first piezoelectric layer. The stopper structure is in electrical communication with the first interdigital transducer electrode and includes a material which reflects at least fifty percent of light having a wavelength of 355 nanometers.

19 Claims, 16 Drawing Sheets

(56) References Cited

U.S. PATENT DOCUMENTS

| | | | |
|---|---|---|---|
| 8,741,683 B2 | 6/2014 | Huang et al. | |
| 8,836,449 B2 * | 9/2014 | Pang | H03H 9/0571 |
| | | | 333/187 |
| 9,647,196 B2 | 5/2017 | Bauer et al. | |
| 9,917,568 B2 * | 3/2018 | Shealy | H03H 3/02 |
| 9,978,929 B2 * | 5/2018 | Hira | H01L 41/0533 |
| 10,090,825 B2 | 10/2018 | Kuroyanagi | |
| 10,396,757 B2 * | 8/2019 | Kakita | H03H 9/14544 |
| 10,601,399 B2 * | 3/2020 | Kawasaki | H03H 9/02992 |
| 10,862,450 B2 * | 12/2020 | Fujiya | H04B 1/38 |
| 2017/0294895 A1 * | 10/2017 | Kakita | H03H 9/0576 |
| 2018/0159503 A1 * | 6/2018 | Takano | H01L 41/338 |

\* cited by examiner

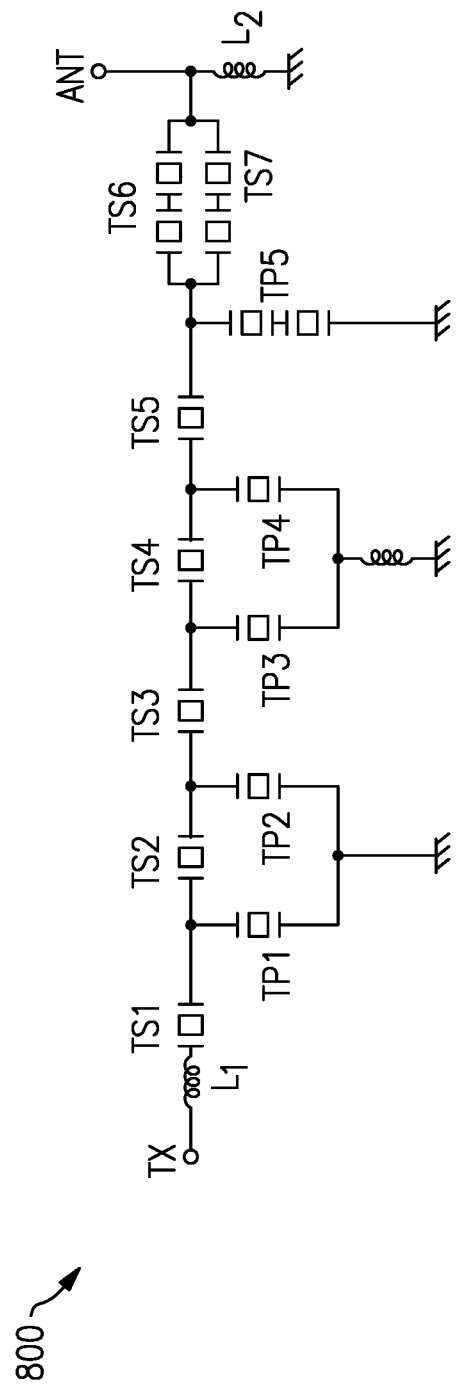
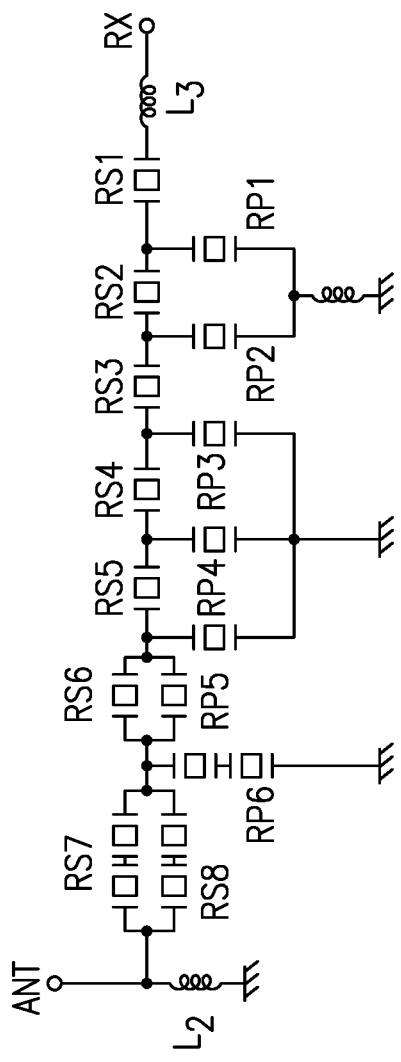
FIG. 8
FIG. 9

US 11,581,870 B2

STACKED ACOUSTIC WAVE RESONATOR PACKAGE WITH LASER-DRILLED VIAS

CROSS REFERENCE TO PRIORITY APPLICATION

This application claims the benefit of priority of U.S. Provisional Patent Application No. 62/907,255, filed Sep. 27, 2019 and titled "ACOUSTIC WAVE RESONATOR WITH LASER-DRILLED VIAS," U.S. Provisional Patent Application No. 62/907,264, filed Sep. 27, 2019 and titled "METHOD OF MAKING ACOUSTIC WAVE RESONATOR WITH LASER-DRILLED VIAS," U.S. Provisional Patent Application No. 62/907,290, filed Sep. 27, 2019 and titled "STACKED ACOUSTIC WAVE RESONATOR PACKAGE WITH LASER-DRILLED VIAS," and U.S. Provisional Patent Application No. 62/907,329, filed Sep. 27, 2019 and titled "METHOD OF MAKING STACKED ACOUSTIC WAVE RESONATOR PACKAGE WITH LASER-DRILLED VIAS," the disclosures of which are hereby incorporated by reference in their entirety herein.

BACKGROUND

Technical Field

Embodiments of this disclosure relate to acoustic wave resonators.

Description of Related Technology

Acoustic wave filters can be implemented in radio frequency electronic systems. For instance, filters in a radio frequency front end of a mobile phone can include acoustic wave filters. An acoustic wave filter can filter a radio frequency signal. An acoustic wave filter can be a band pass filter. A plurality of acoustic wave filters can be arranged as a multiplexer. For example, two acoustic wave filters can be arranged as a duplexer.

An acoustic wave filter can include a plurality of resonators arranged to filter a radio frequency signal. Example acoustic wave filters include surface acoustic wave (SAW) filters and bulk acoustic wave (BAW) filters. A surface acoustic wave resonator can include an interdigital transducer electrode on a piezoelectric substrate. The surface acoustic wave resonator can generate a surface acoustic wave on a surface of the piezoelectric layer on which the interdigital transductor electrode is disposed.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

In one aspect, a packaged acoustic wave component is disclosed. The packaged acoustic wave component can include a first acoustic wave resonator that includes a first interdigital transducer electrode that is positioned over a first piezoelectric layer. The Packaged acoustic wave component can also include a second acoustic wave resonator that includes a second interdigital transducer electrode that is positioned over a second piezoelectric layer. The second piezoelectric layer is bonded to the first piezoelectric layer. The packaged acoustic wave component can further include a stopper structure that is positioned over the first piezoelectric layer. The first stopper structure is positioned above a via that extends through the first piezoelectric layer. The stopper structure is in electrical communication with the first interdigital transducer electrode and includes a material which reflects at least fifty percent of light having a wavelength of 355 nanometers.

In an embodiment, the via is a laser-drilled via.

In an embodiment, the packaged acoustic wave component further includes a second stopper structure that is positioned over the first piezoelectric layer. The second stopper structure can be positioned over a second laser-drilled via extending through the first piezoelectric layer. The second stopper structure can be in electrical communication with the second interdigital transducer electrode. The second stopper structure can include a material which reflects at least fifty percent of light having a wavelength of 355 nanometers.

In an embodiment, the packaged acoustic wave component further includes an interconnect layer that is in electrical communication with the first interdigital transducer electrode and the stopper structure. The interconnect layer can be positioned over at least a portion of the stopper structure.

In an embodiment, the packaged acoustic wave component further includes an interconnect structure that extends between the first piezoelectric layer and the second piezoelectric layer. The interconnect structure can be in electrical communication with the second interdigital transducer electrode and the second stopper structure. The interconnect structure can be positioned over at least a portion of the second stopper structure.

In an embodiment, the packaged acoustic wave component further includes a wall surrounding a region including the first and second acoustic wave resonators. The wall can bond the first piezoelectric layer to the second piezoelectric layer to form a package structure. At least one of the stopper structure or the second stopper structure can be located within the region surrounded by the wall.

In an embodiment, at least one of the stopper structure or second stopper structure includes a material which reflects at least seventy-five percent reflective of light having a wavelength of 355 nanometers.

In an embodiment, at least one of the stopper structure or second stopper structure is an aluminum layer.

In an embodiment, at least one of the stopper structure or second stopper structure has a thickness of less than 5 micrometers.

In an embodiment, the first and second piezoelectric layers are separated by a gap of 30 micrometers or less.

In an embodiment, an overall thickness of the packaged acoustic wave component is less than 200 micrometers.

In an embodiment, the first and second piezoelectric layers are lithium tantalate layers.

In an embodiment, the first and second piezoelectric layers are lithium niobate layers.

In one aspect, a packaged acoustic wave component is disclosed. The packaged acoustic wave component can include a first acoustic wave resonator that includes a first interdigital transducer electrode that is positioned over a first piezoelectric layer. The packaged acoustic wave component can also include a second acoustic wave resonator that includes a second interdigital transducer electrode that is positioned over a second piezoelectric layer. The second piezoelectric layer is bonded to the first piezoelectric to form a package that encapsulates the first and second interdigital transducer electrodes. The packaged acoustic wave component can further include a stopper structure that is positioned over the first piezoelectric layer. The stopper structure that is positioned over a via that extends through the first piezoelectric layer. The stopper structure includes aluminum.

In an embodiment, the via is a laser-drilled via.

In an embodiment, the packaged acoustic wave component further includes a first conductive structure that extends into the via. The first conductive structure can be in electrical communication with the first interdigital transducer electrode.

In an embodiment, the packaged acoustic wave component further includes a second stopper structure that is positioned over the first piezoelectric layer. The second stopper structure can be positioned over a second laser-drilled via that extends through the first piezoelectric layer. The stopper structure and second stopper structure can include aluminum. The packaged acoustic wave component can further include a second conductive structure that extends into the second via. The second conductive structure can be in electrical communication with the second interdigital transducer electrode. The packaged acoustic wave component can further includes an interconnect structure that extends between the first piezoelectric layer and the second piezoelectric layer. The interconnect structure can be in electrical communication with the second interdigital transducer electrode and the second stopper structure. The interconnect structure can be positioned over at least a portion of the second stopper structure.

In an embodiment, the packaged acoustic wave component further includes an interconnect layer that is in electrical communication with the first interdigital transducer electrode and the stopper structure. The interconnect layer can be positioned over at least a portion of the stopper structure.

In an embodiment, the packaged acoustic wave component further includes a wall that bonds a region that includes the first and second acoustic wave resonators. The wall can also bond the first piezoelectric layer to the second piezoelectric layer to form a package.

In an embodiment, the stopper structure has a thickness of less than 5 micrometers.

In an embodiment, the first and second piezoelectric layers are separated by a gap of 30 micrometers or less.

In an embodiment, an overall thickness of the package is less than 200 micrometers.

In an embodiment, the first acoustic wave resonator is associated with a first frequency band, and the second acoustic wave resonator is associated with a second frequency band. The first frequency band can be different than the second frequency band.

In an embodiment, a duplexer comprising the packaged acoustic wave component disclosed herein.

In one aspect, a method of fabricating a packaged acoustic wave component is disclosed. The method can include providing a first acoustic wave resonator that include a first interdigital transducer electrode on a first piezoelectric layer. The first piezoelectric layer supports a stopper structure that includes a material which reflects at least fifty percent of light that has a wavelength of 355 micrometers. The method can also include providing a second acoustic wave resonator that includes a second interdigital transducer electrode positioned on a second piezoelectric layer. The method can further include bonding the first piezoelectric layer to the second piezoelectric layer to form a package structure that encapsulates the first and second interdigital transducer electrodes. The method can further include forming a via by applying laser light to an outside surface of the first piezoelectric layer at a location opposite the stopper structure. The via extends through the first piezoelectric layer and exposing a portion of the stopper structure.

In an embodiment, the first piezoelectric layer further supports a second stopper structure including a material which reflects at least fifty percent of light having a wavelength of 355 micrometers.

In an embodiment, the method further includes applying laser light to the outside surface of the second piezoelectric layer at a location opposite the second stopper structure to form a second laser-drilled via extending through the first piezoelectric layer and exposing a portion of the second stopper structure. The first piezoelectric layer can further support an interconnect structure in contact with the second stopper structure, and the second stopper structure is located between the interconnect structure and the first piezoelectric layer. The method can further include forming a first conductive structure that extends into the via and in contact with the stopper structure and a second conductive structure that extends into the second via and in contact with the second stopper structure. Bonding the first piezoelectric layer to the second piezoelectric layer can include bonding an upper surface of the interconnect structure to an interconnect bond pad that is positioned over the second piezoelectric layer and in electrical communication with the second interdigital transducer electrode.

In an embodiment, the first piezoelectric layer further supports an interconnect layer that is in electrical communication with the first interdigital transducer electrode and the stopper structure. The stopper structure can be located between the first piezoelectric layer and the interconnect layer.

In an embodiment, the first piezoelectric layer further supports a wall structure surrounding the first acoustic wave resonator and the stopper structure in a plan view. Bonding the first piezoelectric layer to the second piezoelectric layer can include bonding an upper surface of the wall structure to a wall bond pad that is positioned over the second piezoelectric layer and surrounding the second acoustic wave resonator.

In an embodiment, the first acoustic wave resonator is associated with a first frequency band and wherein the second acoustic wave resonator is associated with a second frequency band. The first frequency band can be different than the second frequency band.

In one aspect, a method of fabricating a packaged acoustic wave component is disclosed. The method can include providing a first acoustic wave resonator component that includes a first piezoelectric layer. The first piezoelectric layer supports a stopper structure and a first interdigital transducer electrode. The stopper structure including aluminum. The method can also include providing a second acoustic wave resonator component that includes a second piezoelectric layer that supports a second interdigital transducer electrode. The method can further include bonding the first piezoelectric layer to the second piezoelectric layer to form a package encapsulating the first and second interdigital transducer electrodes. The can method further include forming a via by applying laser light to an outside surface of the first piezoelectric layer at a location opposite the stopper structure. The via extends through the first piezoelectric layer and exposes a portion of the stopper structure.

In an embodiment, the first piezoelectric layer further supports a second stopper structure including aluminum. The method can further include applying laser light to the outside surface of the second piezoelectric layer at a location opposite the second stopper structure to form a second laser-drilled via that extends through the first piezoelectric layer and exposes a portion of the second stopper structure. The first piezoelectric layer can further support an interconnect structure that is in contact with the second stopper structure. The second stopper structure can be located between the interconnect structure and the first piezoelectric layer. Bonding the first piezoelectric layer to the second piezoelectric layer can comprise bonding an upper surface of the interconnect structure to an interconnect bond pad that is positioned over the second piezoelectric layer and in electrical communication with the second interdigital transducer electrode.

In an embodiment, the method further includes forming a first conductive structure that extends into the via and in contact with the stopper structure.

In an embodiment, the first acoustic wave resonator is associated with a first frequency band, and the second acoustic wave resonator is associated with a second frequency band. The first frequency band is different than the second frequency band.

In an embodiment, the first and second piezoelectric layers are lithium tantalate layers.

In an embodiment, the first and second piezoelectric layers are lithium niobate layers.

In one aspect, an acoustic wave component is disclosed. The acoustic wave component can include a piezoelectric layer, an interdigital transducer electrode positioned over the piezoelectric layer, a stopper structure that is in electrical communication with the interdigital transducer electrode, and a via extending through the piezoelectric layer to the stopper structure. The stopper structure includes a material which reflects at least fifty percent of light having a wavelength of 355 nanometers.

In an embodiment, the stopper structure includes a material which reflects at least seventy-five percent of light having a wavelength of 355 nanometers.

In an embodiment, the stopper structure is an aluminum layer.

In an embodiment, the stopper structure has a thickness of less than 15 micrometers. The stopper structure can have a thickness of less than 5 micrometers. The stopper structure can have a thickness of more than 1 micrometer.

In an embodiment, a thickness of the stopper structure is less than twenty-two percent of a thickness of the piezoelectric layer. The thickness of the stopper structure can be less than four percent of the thickness of the piezoelectric layer. The thickness of the stopper structure can be at least one percent of the thickness of the piezoelectric layer.

In an embodiment, the via is laser-drilled.

In an embodiment, the via has a frustoconical shape.

In an embodiment, the acoustic wave component further includes an interconnect layer that is in electrical communication with the interdigital transducer electrode and the stopper structure. The stopper structure can be located between the piezoelectric layer and a portion of the interconnect layer. The interconnect layer can be a copper layer.

In an embodiment, the acoustic wave component further includes a conductive structure that extends into the via and in electrical communication with the stopper structure.

In an embodiment, the piezoelectric layer is a lithium tantalate layer.

In an embodiment, the piezoelectric layer is a lithium niobate layer.

In one aspect, an acoustic wave component is disclosed. the acoustic wave component can include a piezoelectric layer, an interdigital transducer electrode positioned over a first surface of the piezoelectric layer, a stopper structure positioned over the first surface of the piezoelectric layer and in electrical communication with the interdigital transducer electrode, a via that extends through a portion of the piezoelectric substrate that is covered by the stopper structure, and a conductive structure that extends into the via and in contact with the stopper structure. The stopper structure includes aluminum.

In an embodiment, the via is a laser-drilled via.

In an embodiment, the conductive structure extends over at least a portion of a second surface of the piezoelectric layer opposite the first surface of the piezoelectric layer.

In an embodiment, the acoustic wave component further includes an interconnect layer that is in electrical communication with the interdigital transducer electrode and the stopper structure. The stopper structure can be located between the piezoelectric layer and the interconnect layer.

In an embodiment, a thickness of the stopper structure is less than four percent of a thickness of the piezoelectric layer.

In an embodiment, the stopper structure has a thickness of less than 5 micrometers.

In an embodiment, the piezoelectric layer is a lithium tantalate layer.

In an embodiment, the piezoelectric layer is a lithium niobate layer.

In one aspect, a method of fabricating an acoustic wave component is disclosed. The method can include forming a stopper structure over a piezoelectric layer. The stopper structure includes a material which reflects at least fifty percent of light having a wavelength of 355 nanometers. The method can also include forming an interdigital transducer electrode over the piezoelectric layer. The interdigital transducer layer is electrically connected to the stopper structure. The method can further include forming a via by applying laser light to the piezoelectric layer on a side of the piezoelectric layer opposite the stopper structure. The via extends through the piezoelectric layer and exposes a portion of the stopper structure.

In an embodiment, the method further includes forming a conductive structure that extends into the via and in contact with the stopper structure.

In an embodiment, the method further includes forming an interconnect structure that is in electrical communication with the stopper structure and the interdigital transducer electrode. At least a portion of the interconnect structure can extend over the stopper structure.

In an embodiment, the stopper structure includes a material which reflects at least seventy-five percent of light having a wavelength of 355 nanometers.

In an embodiment, the stopper structure is an aluminum layer.

In an embodiment, the stopper structure has a thickness of less than 5 micrometers.

In an embodiment, the method further includes using an endpoint detector while applying laser light to the piezoelectric layer to detect exposure of the stopper structure to the etching laser.

In an embodiment, the piezoelectric layer is a lithium tantalate layer.

In an embodiment, the piezoelectric layer is a lithium niobate layer.

In one aspect, a method of fabricating an acoustic wave component is disclosed. The method can include forming a stopper structure over a piezoelectric layer. The stopper structure includes aluminum. The method can also include forming an interdigital transducer electrode over the piezoelectric layer. The interdigital transducer electrode is electrically connected to the stopper structure. The method can further include forming a via by applying laser light to the piezoelectric layer on a side of the piezoelectric layer opposite the stopper structure. The via extends through the piezoelectric layer and exposes a portion of the stopper structure.

In an embodiment, the method further includes forming a conductive structure that extends into the via and in contact with the stopper structure.

In an embodiment, the method further comprises forming an interconnect structure that is in electrical communication with the stopper structure and the interdigital transducer electrode. At least a portion of the interconnect structure can extend over the stopper structure.

In an embodiment, the method further includes using an endpoint detector while applying laser light to the piezoelectric layer to detect exposure of the stopper structure to the etching layer.

In an embodiment, the stopper structure has a thickness of less than 5 micrometers.

In one aspect, a method of fabricating an acoustic wave component is disclosed. The method can include providing a piezoelectric layer with an interdigital transducer electrode and a stopper structure on a first side of the piezoelectric layer. The stopper structure includes a material which reflects at least fifty percent of light having a wavelength of 355 nanometers. The method can also include applying laser light to a second side of a piezoelectric layer opposite to the first side of the piezoelectric layer to form a via through the piezoelectric layer. The via extends through the piezoelectric layer to the stopper structure.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 8 is a schematic diagram of a transmit filter that includes a surface acoustic wave resonator according to an embodiment.

FIG. 9 is a schematic diagram of a receive filter that includes a surface acoustic wave resonator according to an embodiment.

DETAILED DESCRIPTION OF CERTAIN EMBODIMENTS

Figure 1A:
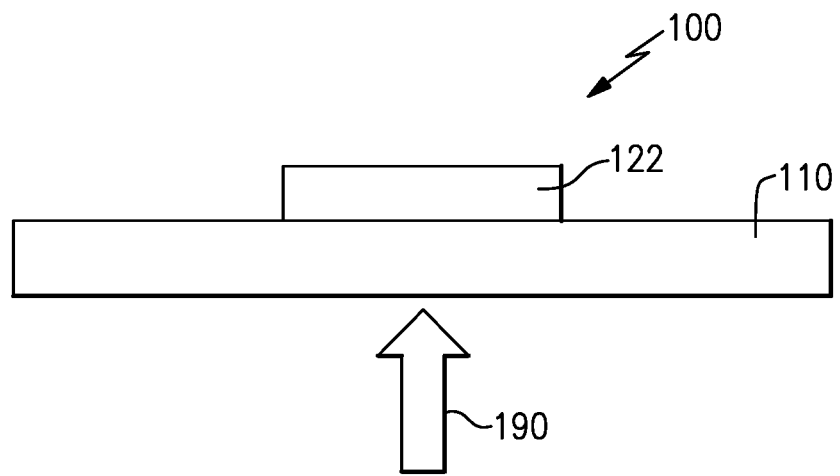
FIGS. 1A and 1B illustrates a cross section of a surface acoustic wave (SAW) resonator component at various stages of a manufacturing process.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Acoustic wave filters can filter radio frequency (RF) signals in a variety of applications, such as in an RF front end of a mobile phone. An acoustic wave filter can be implemented with surface acoustic wave (SAW) resonators.

A manufacturing process of a resonator device can include a laser drilling process to form one or more vias in a substrate, such as a piezoelectric substrate, after the formation of resonator structures on the opposite side of the substrate. The via can allow electrical connections to be formed with interdigital transducer (IDT) electrodes. In some embodiments, the vias allow connections to be made with IDT electrodes in the interior of a package formed by a pair of stacked resonators.

A stopper layer or stopper structure can be utilized on the opposite side of the piezoelectric substrate to be laser drilled. While a copper IDT electrode or a copper interconnect layer in electrical communication with an IDT electrode can be used as a stopper structure, the percentage of laser light absorbed by the copper layer can be substantial. The portions of the copper layer initially exposed by the etching layer can be exposed to a substantial number of additional laser pulses as the remainder of the via is drilled, to achieve its final state. The formation of a sufficiently thick interconnect layer in the region in which the laser via is to be formed can involve the use of expensive deposition techniques, and can affect the thickness of a package formed by a stacked pair of resonators.

Aspects of this disclosure relate to the use of a stopper structure which is highly reflective to the light used in the laser etching process. For example, a stopper layer of aluminum can be used which is roughly six times thinner than a stopper layer made of copper. The stopper structure may be located between the piezoelectric substrate and an interconnect layer including a different material, such as copper. The overall thickness of such a layer stack can be less than the thickness of a comparatively effective stopper layer formed entirely of copper. Because the interconnect layer may not serve as a stopper structure, the interconnect layer can be made thinner, and may be formed using a wider variety of deposition techniques.

FIG. 1A illustrates a cross section of a surface acoustic wave resonator component at a stage of a manufacturing process. The manufacturing process may include a laser etching process. The illustrated SAW resonator component 100 in FIG. 1A includes a piezoelectric layer 110 and an interconnect layer 122 positioned over a first surface the piezoelectric layer 110. The second surface of the piezoelectric layer 110, opposite the interconnect layer 122, is exposed to illumination 190 from an etching laser. In some embodiments, the piezoelectric layer 110 may include a material such as lithium tantalite (LT) or lithium niobate (LN), and the etching layer may emit light at a wavelength of 355 nanometers (nm), suitable for laser etching of a lithium-including piezoelectric substrate. The interconnect layer 122 may be in electrical communication with an IDT electrode (not shown in FIG. 1A), and on the same side of the piezoelectric layer 110 as the interconnect layer.

Figure 1B:
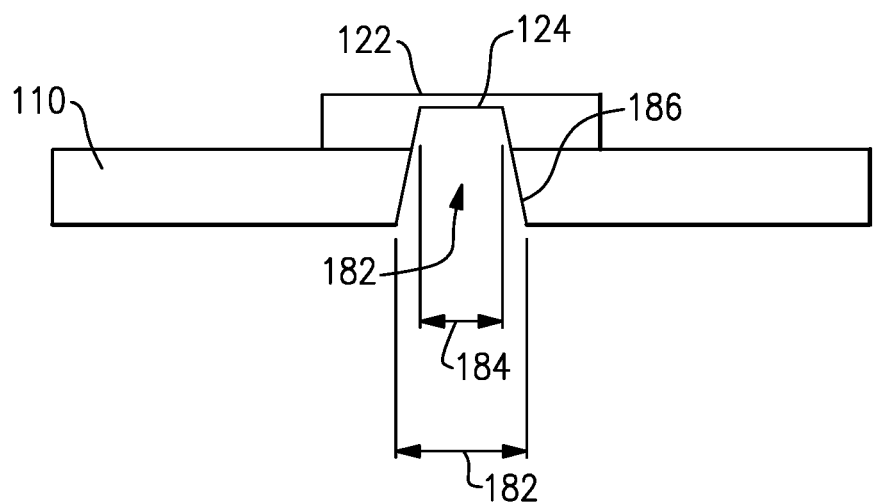

FIG. 1B illustrates a cross section of the surface acoustic wave resonator component of FIG. 1A at a later stage of a manufacturing process. Laser light has been applied to the piezoelectric layer 110, and the laser has ablated a portion of the piezoelectric layer 110 to form a laser-drilled via 180 extending through the piezoelectric layer 110 and exposing a portion of the interconnect layer 122. The laser-drilled via 180 may have a frustoconical shape, with a wider cross-sectional dimension 182 at the opening of the via 112, and a narrower cross-sectional dimension 184 at the base of the via 180, adjacent the interconnect layer 122, such that the via 180 has angled sidewalls 186.

Because of exposure to the laser illumination 190, a section 124 of the interconnect layer 122 has been ablated, melted, or otherwise affected by exposure to the laser pulses, such that the laser-drilled via 180 extends into the interconnect layer 122. Although described as a section 124 of the interconnect layer 122 the section 124 may in some embodiments be a portion of an IDT electrode itself. In some embodiments, the laser etching process may be monitored using an endpoint detector to detect plasma generated by ablation of the lithium-containing piezoelectric layer. When the plasma generation tapers off, the laser etching process may be stopped. However, there may be as many as 20 or 30 additional laser pulses emitted between the point at which the interconnect layer 122 is first exposed and the point at which the via 180 has been fully etched.

The interconnect layer 122 may not be directly in contact with the piezoelectric layer 110 in the area overlying the via 180. In various embodiments, additional layers not specifically illustrated in FIGS. 1A and 1B may be disposed between the interconnect layer 122 and the piezoelectric layer 110. Depending on the thickness and composition of these layers, such layers may have minimal effect on the laser-etching process.

In some embodiments, the overall height of a SAW resonator may be constrained by various design considerations. For example, SAW resonators may be provided in a stacked arrangement, with a first SAW resonator positioned over a first surface of a first piezoelectric substrate, and a second SAW resonator positioned over a first surface of a second piezoelectric substrate, with the first surfaces of the first and second substrates facing one another.

Figure 2:
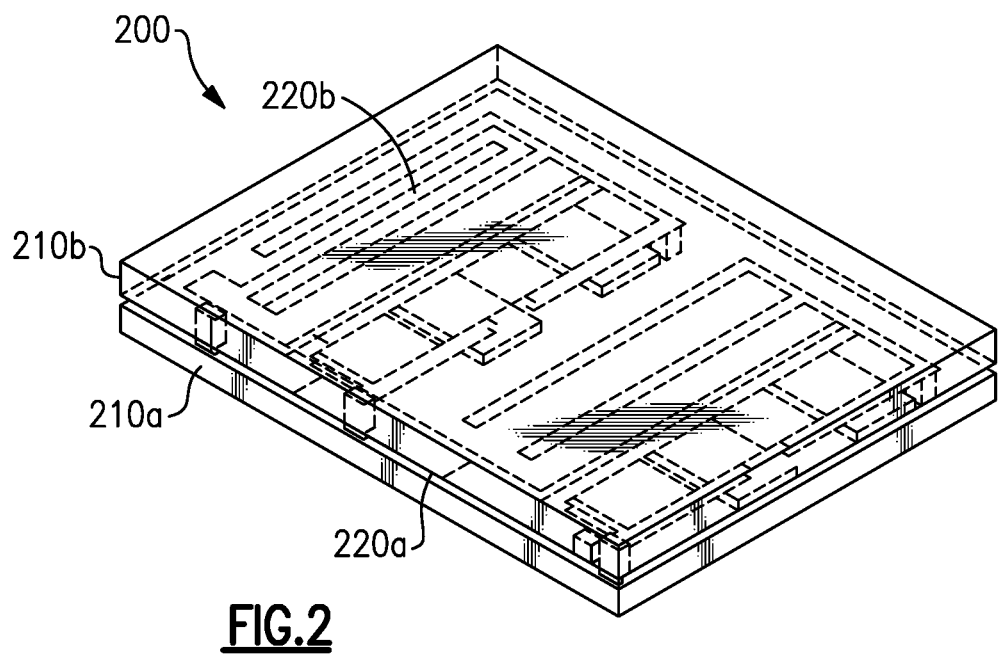
FIG. 2 illustrates a perspective view of a packaged acoustic wave component including a first surface acoustic wave resonator component positioned over a first wafer and a second surface acoustic wave resonator component positioned over a second wafer.

FIG. 2 illustrates a perspective view of a packaged acoustic wave component 200 including a first surface acoustic wave resonator component positioned over a first wafer and a second surface acoustic wave resonator component positioned over a second wafer. The first SAW resonator component 220a positioned over the lower piezoelectric wafer 210a may be associated with a first frequency band, and the second SAW resonator component 200b positioned over the upper piezoelectric wafer 210b may be associated with a second frequency band. Each of the SAW resonator components 200a and 200b can include any suitable number of SAW resonators. The packaged acoustic wave component 200 (e.g., stacked resonator structure) may be configured to operate as a duplexer, with one of the first SAW resonator component 220a or the second SAW resonator component 220b configured to operate as a receive filter, and the other configured to operate as a transmit filter.

The lower piezoelectric wafer 210a may be wafer bonded to the upper piezoelectric wafer 210b using any suitable wafer bonding technique, for example, as discussed in greater detail below. The lower piezoelectric wafer 210a and the upper piezoelectric wafer 210b may form a package enclosing the IDT electrodes of SAW resonator component 220a and the second SAW resonator component 220b.

Figure 3:
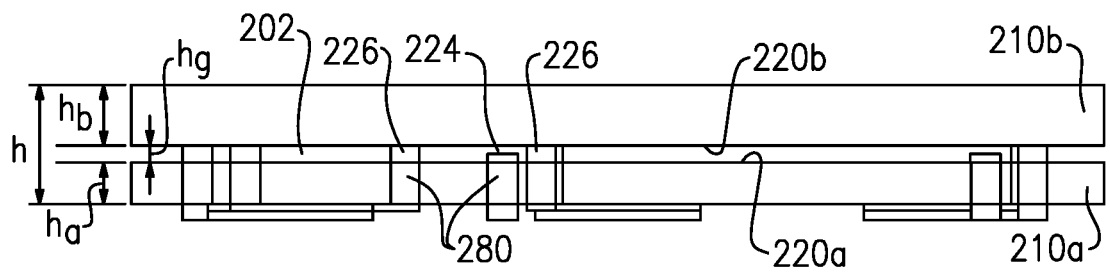
FIG. 3 illustrates a cross section of a packaged acoustic wave component such as the packaged acoustic wave component of FIG. 2.

FIG. 3 illustrates a cross section of a packaged acoustic wave component such as the packaged acoustic wave component of FIG. 2. The upper piezoelectric wafer 210b has a thickness of $h_b$, the lower piezoelectric wafer 210a has a thickness of $h_a$, and there is a gap 202 of thickness $h_g$ between the upper piezoelectric wafer 210b and the lower piezoelectric wafer 210a. The package has an overall thickness of h, where h is given by the sum of $h_a$, $h_b$, and $h_g$.

Vias 280 extend through at least one of the upper piezoelectric wafer 210b and the lower piezoelectric wafer 210a, allowing electrical connections to be made with the IDT electrodes of the first SAW resonator component 220a and/or the second SAW resonator component 220b. In the illustrated embodiment, the upper piezoelectric wafer 210b is thicker than the lower piezoelectric wafer 210a. In such an embodiment, the vias 280 may be formed in the thinner lower piezoelectric wafer 210a, to facilitate formation of the vias 280 without etching through the additional thickness of the upper piezoelectric wafer 210b.

In the illustrated embodiment, certain of the vias 280 are in electrical connection with the IDT electrodes of the first SAW resonator component 220a or with a conductive structure 224 in electrical communication with the IDT electrodes of the first SAW resonator component 220a. Other of the vias 280 are in electrical connection with the IDT electrodes of the second SAW resonator component 220b via a conductive structure 226 extending between the lower and upper piezoelectric wafers 210a and 210b. The conductive structure 226 may be a layer of conductive material or a stack of layers of conductive material. In some embodiments, the conductive structure 226 may be formed by bonding a conductive structure positioned over the upper piezoelectric wafer 210b to a conductive structure positioned over the lower piezoelectric wafer 210a.

The conductive structures 224 and 226 serve as stopper structures for the laser etching of the vias 280, and are of sufficient thickness to withstand the laser etching process while the vias 280 are being formed. In an embodiment in which the vias 280 are formed after the upper piezoelectric wafer 210b is bonded to the lower piezoelectric wafer 210a to form a package, the conductive structures 224 and 226 are of sufficient thickness that the laser does not pierce the conductive structure 224 and 226 and expose portions of the upper piezoelectric wafer 210b or the second SAW resonator component 220b to the etching laser.

The thickness of the conductive structures 224 and 226c can constrain the minimum thickness $h_g$ of the gap 202, and thereby constrain a minimum overall thickness h of the package. The thickness of the conductive structures 224 and 226 may be dependent on a number of factors, one of which is the composition of the conductive structures 224 and 226.

Figure 4A:
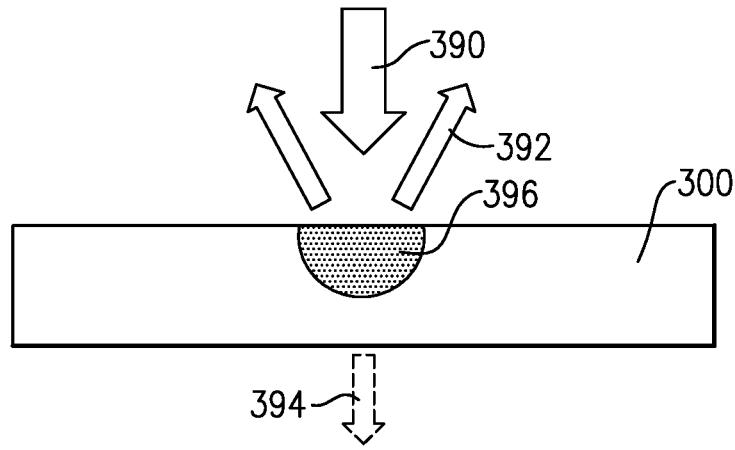
FIG. 4A is a cross section schematically illustrating the response of a material to impingement of a laser.

FIG. 4A is a cross section schematically illustrating the response of a material to impingement of a laser. The material 300 is exposed to illumination 390 from an etching laser. In some embodiments, the illumination 390 from the etching layer may be a series of discrete pulses. A portion of the illumination 390 incident upon the material 300 is reflected as reflected radiation 392. The reflected radiation 392 may be scattered over a range of angles, due in part to the surface conditions of the material 300 and the composition of the material 300. Another portion of the illumination 390 may be transmitted through the material as transmitted illumination 394. Another portion of the illumination 390 may be absorbed by the material 300 as absorbed radiation 396.

All of the illumination 390 incident upon the material 300 should be either absorbed as absorbed radiation 396, transmitted as transmitted illumination 394, or reflected as reflected radiation 392. The respective percentages of illumination 390 absorbed as absorbed radiation 396, transmitted as transmitted illumination 394, and reflected as reflected radiation 392 should therefore add to 100%. For metallic materials of sufficient thickness, no radiation should be transmitted through the material 300, and all of the incident laser light will either be absorbed as absorbed radiation 396 or reflected as reflected radiation 392. The reflectivity of the material 300 to a given source of illumination 390 will therefore be directly related to the amount of illumination 390 absorbed by the material 300.

Figure 4B:
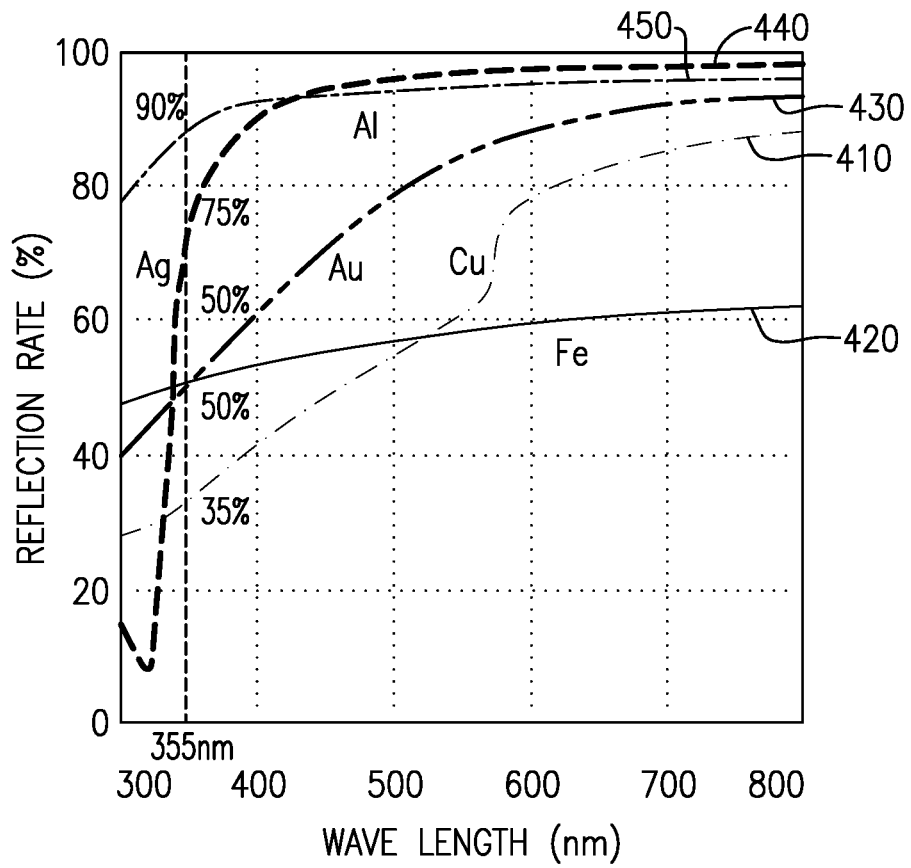
FIG. 4B is a graph showing the reflection ratios of various metals as a function of wavelength.

FIG. 4B is a graph showing the reflection ratios of various metals as a function of wavelength. Curve 410 illustrates the reflection ratio of copper (Cu) as a function of wavelength. In particular, at 355 nm, the reflectivity of copper is roughly 35%. As a sufficiently thick layer of copper will not transmit light therethrough, nearly two-thirds of light emitted at 355 nm will be absorbed by the copper layer. The use of copper as a stopper layer for a 355 nm etching laser can involve a layer which is thicker than the other metals shown in the graph of FIG. 4B, as a substantial amount of energy from the laser will be absorbed by a copper stopper layer once the underlying layer has been etched to expose a portion of the copper stopper layer. This absorption of laser energy will result in melting or ablation of the stopper layer Curves 420 and 430 illustrate the reflection ratios of iron (Fe) and gold (Au) as functions of wavelength. Both iron and gold have a reflectivity of roughly 50% at 355 nm. The absorption rate of iron or gold is roughly 75% of the absorption rate of copper. The use of iron or gold as a stopper layer allows the use of a stopper layer which is roughly 25% thinner than a comparatively effective copper layer.

Curve 440 illustrates the reflection ratio of silver (Ag) as a function of wavelength. The reflectivity of silver at 355 nm is roughly 75%, and the absorption rate of silver at that wavelength is roughly 38% that of the absorption rate of copper. A silver layer used as a stopper layer may be more than 61% thinner than a comparably effective copper layer.

Curve 440 illustrates the reflection ratio of silver (Ag) as a function of wavelength. The reflectivity of silver at 355 nm is roughly 75%, and the absorption rate of silver at that wavelength is roughly 38% that of the absorption rate of copper. A silver layer used as a stopper layer may be more than 61% thinner than a comparably effective copper layer.

Curve 450 illustrates the reflection ratio of aluminum (Al) as a function of wavelength. While silver is more reflective than aluminum in the visible wavelengths, the reflectivity of aluminum remains high for shorter wavelengths in the near-visible range, while the reflectivity of silver drops below that of aluminum. For light having a wavelength of 355 nm, the reflectivity of aluminum is roughly 90%, and the absorption rate of aluminum at that wavelength is roughly 15.4% that of copper. An aluminum layer can therefore be 84.6% thinner than a copper stopper layer, while providing equivalent protection for a 355 nm etching laser.

By utilizing an aluminum stopper layer, the thickness of the stopper layer may be reduced by almost an order of magnitude. In a package such as the package of FIGS. 2 and 3, the thickness of the stopper layer may be a controlling factor in minimizing the thickness $h_g$ of the gap 202 between the upper piezoelectric wafer 210b and the lower piezoelectric wafer 210a. The thickness $h_g$ of the gap 202, in turn, can be a controlling factor in the overall thickness of the package. If one of the wafers is roughly 70 micrometers (um) in thickness, and the other of the wafers is roughly 100 um in thickness, an overall package thickness of 200 um can be provided if the thickness $h_g$ of the gap 202 is less than 30 um.

Figure 5A:
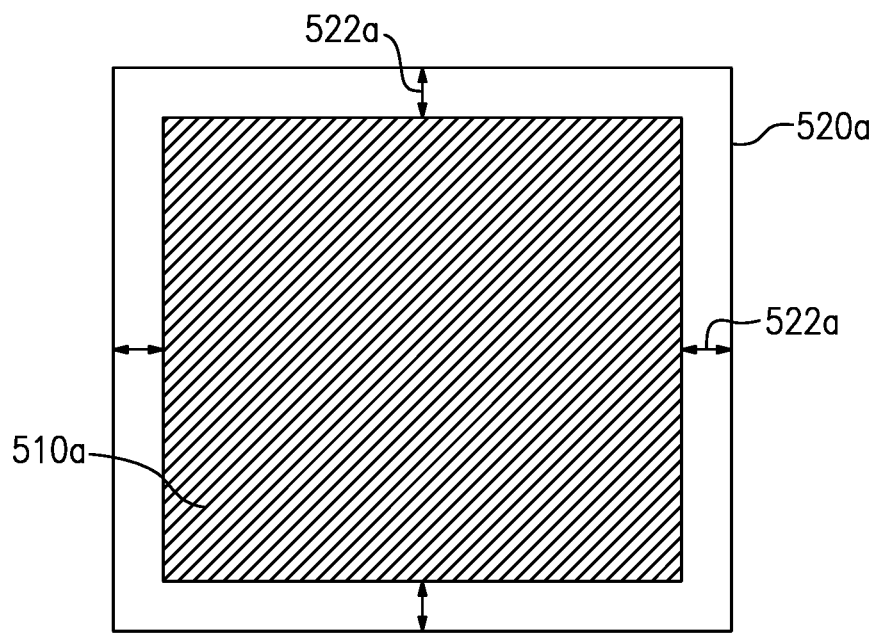
FIG. 5A is a top plan view schematically illustrating the footprint of a single surface acoustic wave resonator component.

In some embodiments, the overall footprint of a packaged acoustic wave component including stacked resonators can be less than the footprint of two resonators side-by-side on a single substrate. Because of modifications to the design of the resonators to accommodate, for example, interconnections between the lower wafer and the upper wafer, FIG. 5A shows that a footprint 520a of a single surface acoustic wave resonator component extends beyond the boundaries of the functional area 510a of the resonator component by a distance 522a. Although the functional area 510a of the resonator component is schematically depicted as being centered within the footprint 520a, the actual positioning of the functional area 510a of the resonator component within the footprint 520a may vary depending on the design of the resonator component.

Figure 5B:
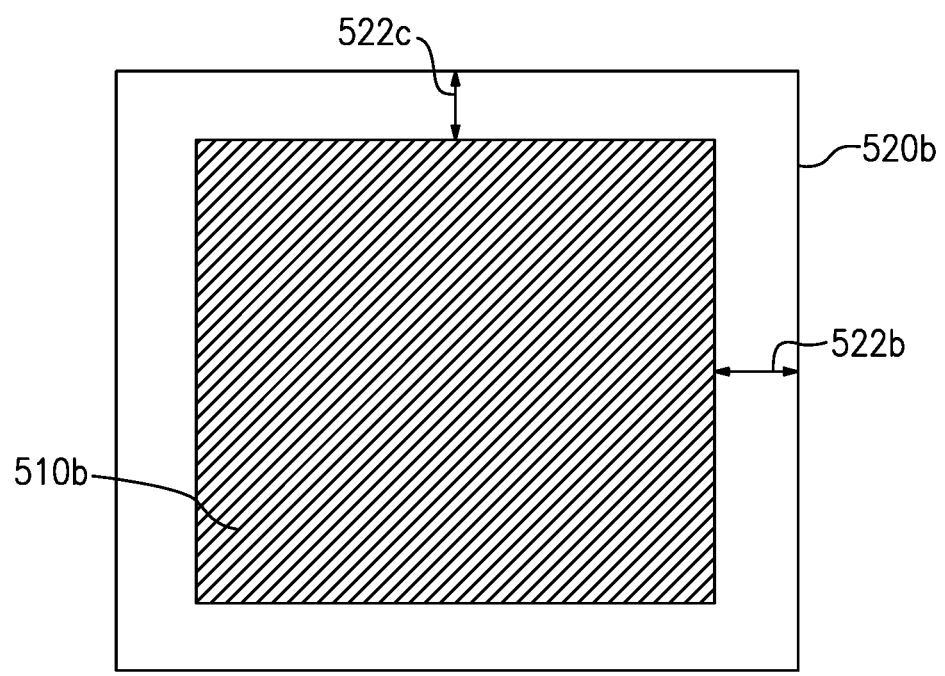
FIG. 5B is a top plan view schematically illustrating the footprint of a packaged acoustic wave component including a pair of stacked resonators.

In contrast, FIG. 5B shows that the footprint 520b of a resonator component of a packaged acoustic wave component including a stacked resonator design is larger than the footprint 520a of FIG. 5A. In addition, it can be seen that the footprint 520b may be wider in a lateral direction than in a longitudinal direction. The footprint 520b of the resonator component extends beyond the boundaries of the functional area 510b of the larger of the resonator components by a distance 522b in a lateral direction, and in by distance 522c in a longitudinal direction. In an embodiment in which the lateral distance 522b is longer than the longitudinal distance 522c, the additional length may be due to the placement of vias extending through one of the substrates and allowing electrical communication with each of the resonator components in the stacked resonator package. In embodiments in which the vias are formed in only one of the two substrates, a conductive pillar may extend between the two substrates of the package, allowing electrical communication with the resonator component positioned over the upper substrate through a via formed through the lower substrate. A package wall sealing the first substrate to the second substrate will also increase the size of the footprint 520b.

As discussed above with respect to the resonator of FIG. 5A, although the functional area 510b of the resonator component of FIG. 5B is schematically depicted as being centered within the footprint 520b, the actual positioning of the functional area 510b of the resonator component within the footprint 520b may vary depending on the design of the resonator component. For example, a via providing electrical communication with the upper resonator component may be on the opposite side of the lower resonator component as a via providing electrical communication with the lower resonator component, or both vias may be on the same side of the lower resonator component.

Despite the additional size of the footprint 520b, the stacked resonator arrangement of the packaged acoustic wave component allows the overall footprint 520b of two resonator components to be smaller than the total footprint of two resonator component footprints 520a side-by-side. The total reduction in size will vary depending on the relative size of the functional area 510b relative to the components formed in the remainder of the footprint. In some embodiments, a reduction of at least 35% can be achieved via a stacked resonator arrangement. In other embodiments, a reduction of almost 45% or more can be achieved via a stacked resonator arrangement.

While the footprint of the packaged acoustic wave component including stacked resonators can be reduced in comparison to a side-by-side arrangement of two resonator components, the height of the stacked resonator components is increased. Depending on the amount of height increase, this height increase may make a stacked arrangement unsuitable for certain implementations. If the stacked packaged acoustic wave component can be made sufficiently thin, the stacked packaged acoustic wave component can be used in place of a pair of side-by-side resonator components in certain implementations. For example, some implementations may desire a package thickness of less than 200 um.

If a copper stopper structure is used when forming laser-drilled vias, the space for the thick copper stopper structure may make achieving such a package impractical or impossible. By using a stopper structure which is more reflective to the illumination from a 355 nm etching laser, the specified spacing between the package substrates may be reduced. If a sufficiently reflective material is used as the stopper structure, the specified spacing between the package substrates may become a function of resonator dimensions or other package components, rather than stopper structure dimensions.

FIGS. 6A-6E illustrate cross sections of a surface acoustic wave resonator component at various stages of a manufacturing process. The manufacturing process may include a laser etching process. The illustrated SAW resonator component 600 in FIG. 6A includes a piezoelectric layer 610 and an interconnect layer 622 positioned over a first surface the piezoelectric layer 610. The interconnect layer 622 may be in electrical communication with an IDT electrode (not shown in FIG. 6A) and on the same side of the piezoelectric layer 610 as the interconnect layer 622.

Figure 6A:
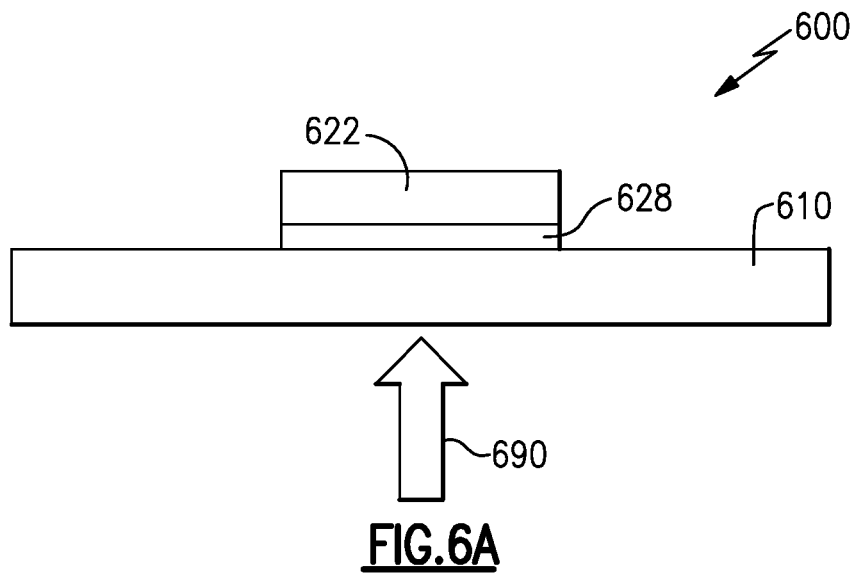
FIGS. 6A to 6E illustrate cross-sections of a portion of a surface acoustic wave resonator component at various stages of a manufacturing process according to an embodiment.

The SAW resonator component 600 of FIG. 6A differs from the SAW resonator component 100 of FIG. 1A in that the interconnect layer 622 includes a stopper layer 628 located between the interconnect layer 622 and the piezoelectric layer 610 in at least one section of the interconnect layer 622. In some embodiments, the stopper layer includes a material which is at least 50% reflective to illumination at a wavelength of 355 nm. In some of these embodiments, the stopper layer includes a material which is at least 75% reflective to illumination at a wavelength of 355 nm. In certain embodiments, the stopper layer 628 includes aluminum.

By using a stopper layer 628 that is relatively highly reflective of laser light (e.g., an aluminum stopper layer), the stopper layer 628 can be relatively thin compared to a less reflective stopper layer (e.g., a copper stopper layer). For example, the stopper layer 628 can have a thickness of less than 15 micrometers. In some instances, the stopper layer 628 can have a thickness of less than 5 micrometers. In some instances, the stopper layer 628 can have a thickness of less than 3 micrometers. The stopper layer 628 can have a thickness in a range from 1 micrometer to 15 micrometers, such as in a range from 1 micrometer to 5 micrometers. The stopper layer 628 can have a thickness that is less than about 25% of a thickness of the piezoelectric layer 610, such as less than 22% of the thickness of the piezoelectric layer 610. In some instances, the thickness of the stopper layer 628 is less than 4% of the thickness of the piezoelectric layer 610.

The second surface of the piezoelectric layer 610, opposite the interconnect layer 622 and in the region of the stopper layer 628, is exposed to illumination 690 from an etching laser. As previously discussed, the piezoelectric layer 610 may include a material such as lithium tantalite (LT) or lithium niobate (LN), and the etching layer may emit light at a wavelength of 355 nm, suitable for laser etching of a lithium-including piezoelectric substrate.

Figure 6B:
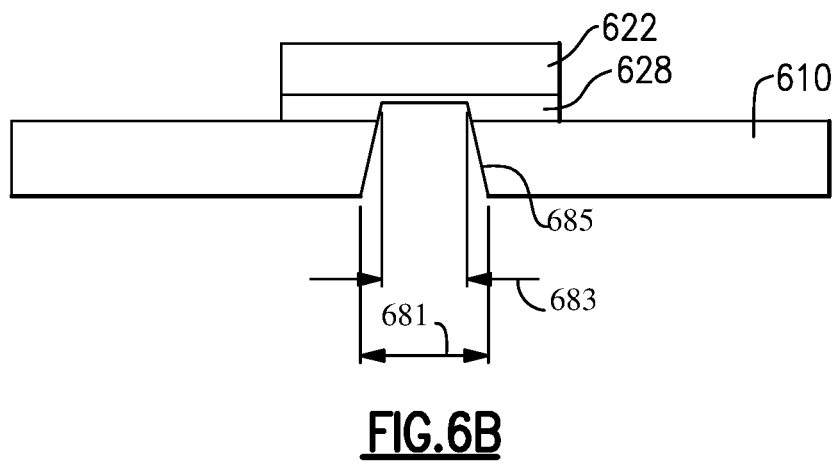

FIG. 6B illustrates a cross section of the surface acoustic wave resonator component of FIG. 6A at a later stage of a manufacturing process. The etching laser has ablated a portion of the piezoelectric layer 610 to form a laser-drilled via 680 extending through the piezoelectric layer 610 and into a portion of the stopper layer 628. However, the stopper layer 628 has prevented the via from extending into the overlying interconnect layer 622. The laser-drilled via 680 has a generally frustoconical shape, with a wider cross-sectional dimension 681 at the opening of the via 680, and a narrower cross-sectional dimension 683 at the base of the via 680, adjacent the interconnect layer 622, such that the via 680 has angled sidewalls 685.

Because of exposure to the laser illumination 190, a section of the stopper layer 628 has been ablated, melted, or otherwise affected by exposure to the laser pulses, such that the laser-drilled via 680 extends into the stopper layer 628. Although the stopper layer 628 is depicted as underlying a section of the interconnect layer 622 the stopper layer 628 may in some embodiments underlie a portion of an IDT electrode itself.

As previously discussed, the laser etching process may be monitored using an endpoint detector to detect plasma generated by ablation of the lithium-containing piezoelectric layer. When the plasma generation tapers off, the laser etching process can be stopped. However, there may be as many as 20 or 30 additional laser pulses emitted between the point at which the stopper layer 628 is first exposed and the point at which the via 680 has been fully etched.

The stopper layer 628 may not be directly in contact with the piezoelectric layer 610 in the area overlying the via 680. In various embodiments, additional layers not specifically illustrated in FIGS. 6A and 6B may be disposed between the stopper layer 628 and the piezoelectric layer 610. Depending on the thickness and composition of these layers, such layers may have minimal effect on the laser-etching process.

Figure 6C:
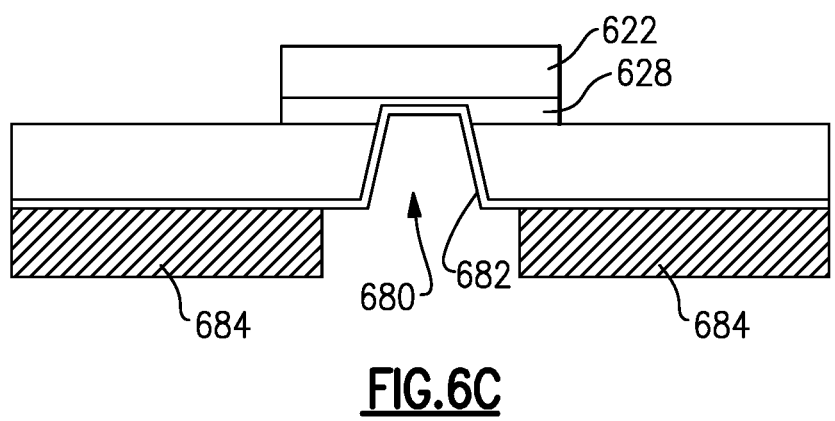

In FIG. 6C, it can be seen that a seed layer 682 has been sputter deposited on the side of the piezoelectric layer 610 opposite the interconnect layer 622 and the stopper layer 628. In addition, a photoresist layer 684 has been formed over the seed layer 682, and patterned to expose a portion of the seed layer 682 covering the interior of the via 680.

Figure 6D:
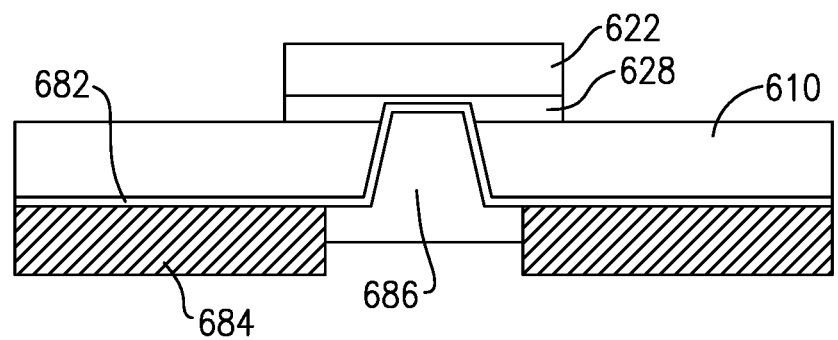

In FIG. 6D, it can be seen that an interconnect structure 686 has been formed over the exposed portion of the seed layer 682, such that the interconnect structure 686 covers at least the via 680 and the portion of the seed layer 682 immediately surrounding the via 680. The interconnect structure 686 may be formed, for example, by electroplating onto the seed layer 682. The interconnect structure 686 may include copper or other suitable conductive materials. The interconnect structure 686 may include multiple layers of materials, such as a layer of copper followed by a layer of tin.

Figure 6E:
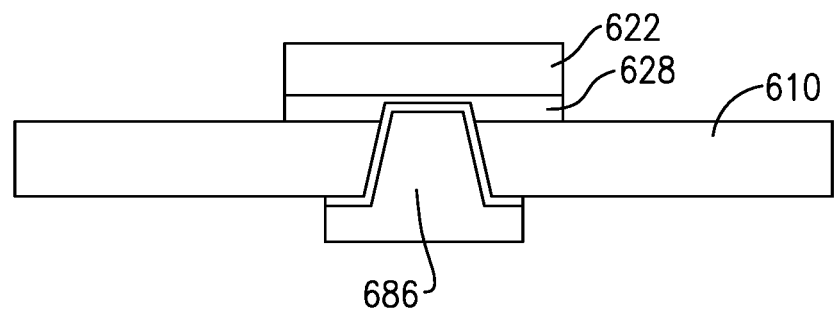

In FIG. 6E, the photoresist layer 684 and the seed layer 682 have been removed, leaving the interconnect structure 686. The interconnect structure 686 extends into the via 680, and is in electrical communication with the interconnect layer 622 on the opposite side of the piezoelectric layer 610, allowing communication through the piezoelectric layer.

Figure 7A:
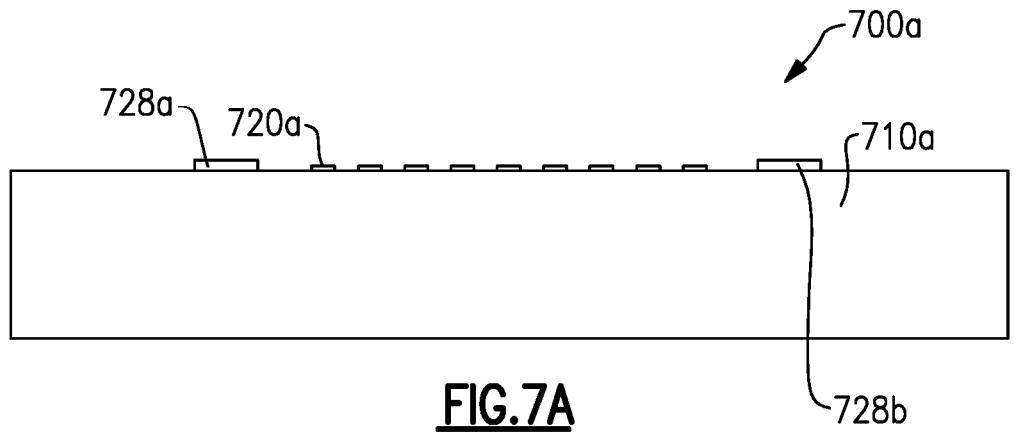
FIGS. 7A to 7O illustrate cross-sections of a packaged acoustic wave component including first and second surface acoustic wave resonator components at various stages of a manufacturing process according to an embodiment.

Similar processes can be used as part of a fabrication process for a packaged acoustic wave component with a stacked resonator arrangement. FIGS. 7A to 7K illustrate cross sections of a packaged acoustic wave component at various stages of a manufacturing process. In FIG. 7A, a surface acoustic wave (SAW) resonator wafer 700*a* is provided, including a piezoelectric layer 710*a* having a plurality of IDT electrodes 720*a* formed thereon. In some embodiments, the piezoelectric layer 710 may include any suitable piezoelectric material such as a lithium niobate (LN) layer or a lithium tantalate (LT) layer. As will be described in greater detail below, the thickness of the piezoelectric layer 710*a* in the provided SAW wafer 700*a* may not correspond to the final thickness of the piezoelectric layer 710*a* in the final SAW package. In addition, stopper structures 728*a* and 728*b* have been formed on portions of the piezoelectric layer 710*a* adjacent the plurality of IDT electrodes 720*a*. Additional structures not depicted in FIG. 7A may also be formed, including electrodes in electrical communication with the plurality of IDT electrodes 720*a*. Such electrodes may include aluminum, and may be thicker than the plurality of IDT electrodes 720*a*.

In some embodiments, the stopper structures 728*a* and 728*b* each include a material which is at least 50% reflective to illumination at a wavelength of 355 nm. In some of these embodiments, the stopper structures 728*a* and 728*b* each include a material which is at least 75% reflective to illumination at a wavelength of 355 nm. In certain embodiments, the stopper structures 728*a* and 728*b* each include aluminum.

By using stopper structures 728*a* and 728*b* that are relatively highly reflective of laser light (e.g., aluminum stopper structures), the stopper structures 728*a* and 728*b* can be relatively thin compared to less reflective stopper structures (e.g., copper stopper structures). For example, the stopper structures 728*a* and 728*b* can each have a thickness of less than 15 micrometers. In some instances, the stopper structures 728*a* and 728*b* can each have a thickness of less than 5 micrometers. In some instances, the stopper structures 728*a* and 728*b* can each have a thickness of less than 3 micrometers. The stopper structures 728*a* and 728*b* can each have a thickness in a range from 1 micrometer to 15 micrometers, such as in a range from 1 micrometer to 3 micrometers. The stopper structure 728*a* can have a thickness that is less than about 25% of a thickness of the piezoelectric layer 710*a*, such as less than 22% of the thickness of the piezoelectric layer 710*a*. In some instances, the thickness of the stopper structure 728*a* is less than 4% of the thickness of the piezoelectric layer 710*a*.

Figure 7B:
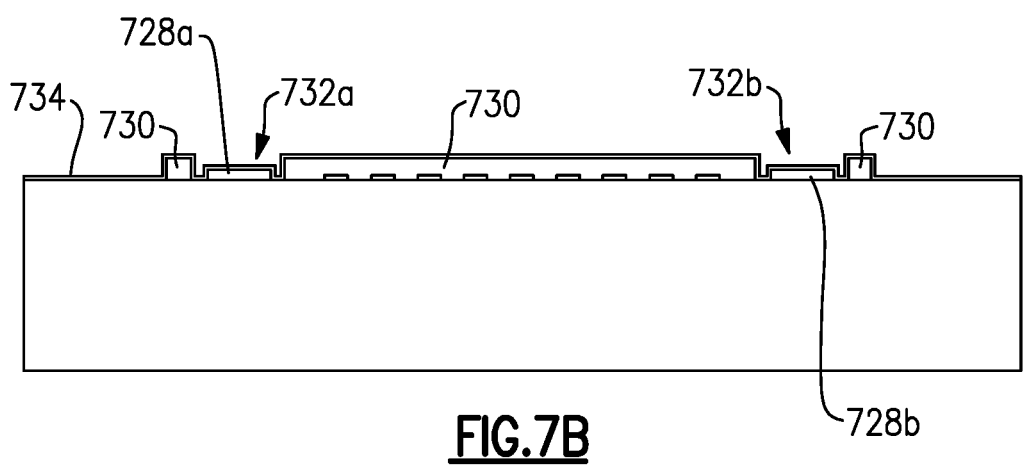

In FIG. 7B, a first photoresist layer has been deposited over the SAW wafer 700*a*, and patterned via photolithography to leave a first photoresist layer 730 extending over the IDT electrodes 720*a* and stopper structures 728*a* and 728*b*, and including apertures 732*a* and 732*b* adjacent the IDT electrode layers and overlying the stopper structures 728*a* and 728*b*. The apertures 732*a* and 732*b* in the first photoresist layer 730 will be used in part to define the locations of stop structures under which laser-drilled vias can be formed. In addition, a seed layer 734 has been formed over the first photoresist layer 730. In some embodiments, the seed layer 734 can include titanium (Ti), copper (Cu), or any other suitable material. In some embodiments, the seed layer 734 can be formed via sputter deposition, or any other suitable deposition method.

Figure 7C:
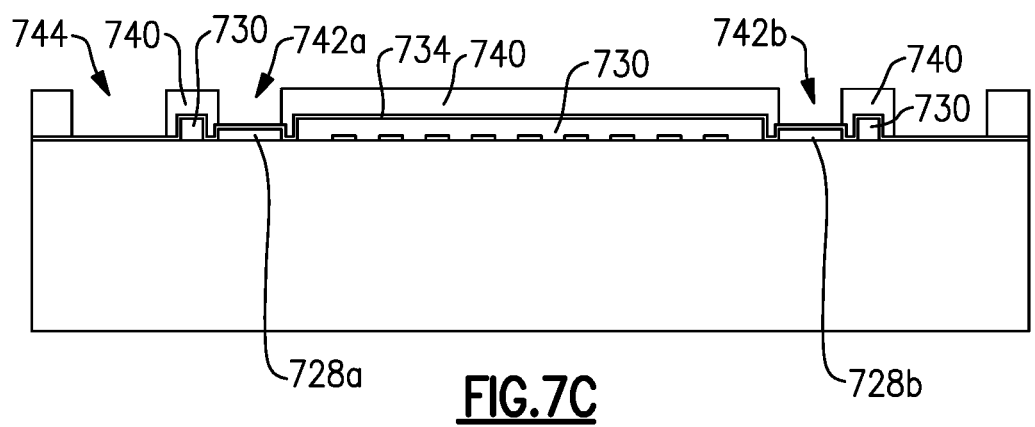

In FIG. 7C, a second photoresist layer 740 has been formed over the first photoresist layer 730 and the seed layer 734, and patterned via photolithography to form inner apertures 742*a* and 742*b*, as well as an outer aperture 744 extending around the IDT electrodes 720 and the inner apertures 742*a* and 742*b*. The inner apertures 742*a* and 742*b* overlie the stopper structures 728*a* and 728*b*, and are aligned with the apertures 732*a* and 732*b* in the first photoresist layer 730, but are slightly smaller, such that the seed layer 740 on the sidewalls of the apertures 732*a* and 732*b* are covered by portions of the second photoresist layer 740. The apertures 732*a* and 732*b* are depicted in the illustrated embodiment as having similar dimensions to the underlying stopper structures 728*a* and 728*b*, but in other embodiments, the stopper structures 728*a* and 728*b* may be larger or smaller in some dimensions than the apertures 732*a* and 732*b*. The outer aperture 744 will be used in part to define the locations of a package wall.

Figure 7D:
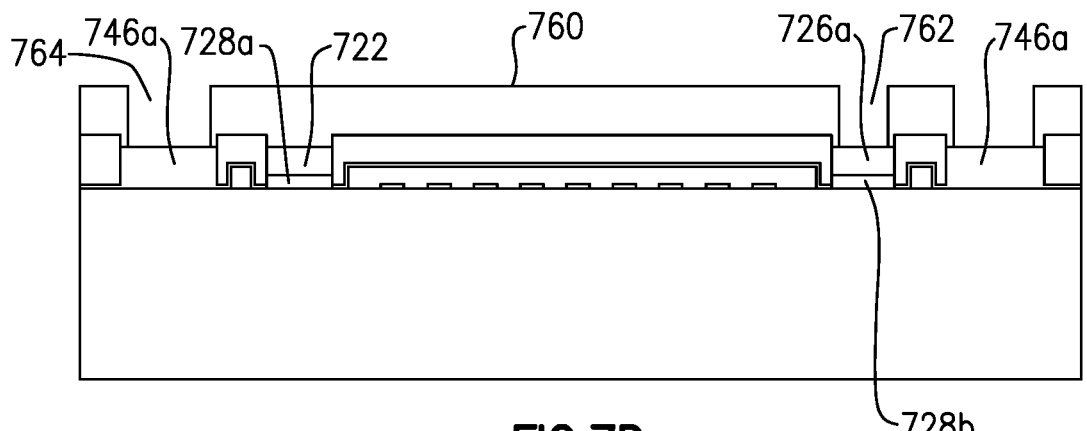

In FIG. 7D, additional structures have been formed within the outer aperture 744 and the inner apertures 742*a* and 742*b*, overlying the stopper structures 728*a* and 728*b*. An interconnect layer 722 has been formed within inner aperture 742*a*, overlying the stopper structure 728*a*. The interconnect layer 722 can be used to form a connection with the IDT electrodes 720, and may extend beyond the edge of the stopper structure 728*a*. A lower layer 726*a* of an internal interconnect pillar has been formed within inner aperture 742*b*, overlying the stopper structure 728*b*. A lower wall layer 746*a* has been formed within the outer aperture 744. In some embodiments, the interconnect layer 722, the lower layer 726*a* of the internal interconnect pillar, and the lower wall layer 746*a* can be formed via an electroplating process or other suitable process, and can include copper or another suitable material.

In the illustrated embodiment, a third photoresist layer 760 has been formed over the second photoresist layer 740.

The third photoresist layer 760 has been patterned to form an aperture 762 exposing a section of the lower layer 726a of the internal interconnect pillar, and to form an aperture 764 exposing a section of the lower wall layer 746a. The third photoresist layer 760 extends over the interconnect layer 722 without exposing a portion of the interconnect layer 722.

Figure 7E:
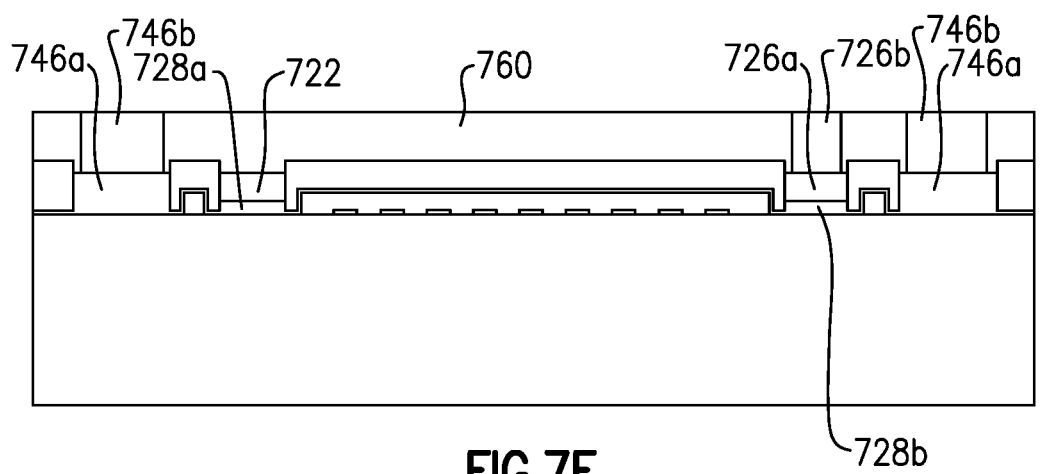

In FIG. 7E, a middle wall layer 746b has been formed within the aperture 764 of the third photoresist layer 760, over the lower wall layer 746a. A middle layer 726b of the internal interconnect pillar has been formed within the aperture 762 of the third photoresist layer 760, over the lower layer 726a of the internal interconnect pillar. In the illustrated embodiment, the middle wall layer 746b and the middle layer 726b of the internal interconnect pillar are shown as extending to roughly the height of the upper surface of the internal third photoresist layer 760, but in other embodiments, the middle wall layer 746b and the middle layer 726b of the internal interconnect pillar can extend to heights either above or below the upper surface of the third photoresist layer 760.

Figure 7F:
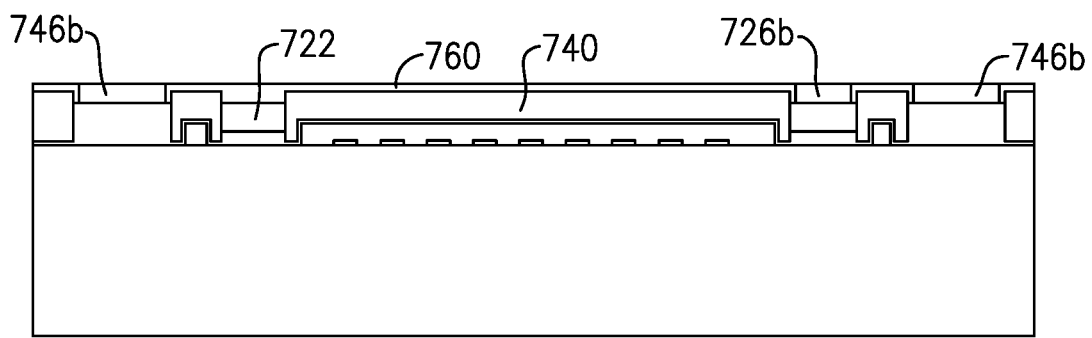

In FIG. 7F, the partially fabricated resonator component has been be planarized down to a desired height. This planarization process has reduced the thickness of the third photoresist layer 760 as well as the thicknesses of the middle wall layer 746b and the middle layer 726b of the internal interconnect pillar. The middle wall layer 746b and the middle layer 726b of the internal interconnect pillar still extend to a height greater than the height of the interconnect layer 722, and a portion of the third photoresist layer 760 still extends over the interconnect layer 722. By planarizing the third photoresist layer 760, the middle wall layer 746b, and the middle layer 726b of the internal interconnect pillar to a desired height, the overall height of the resulting package can be reduced and/or minimized.

Figure 7G:
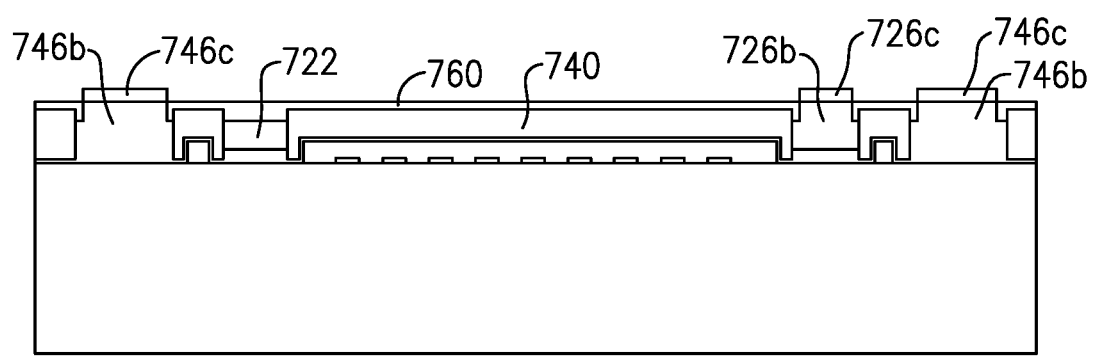

In FIG. 7G, an upper wall layer 746c has been formed over the middle wall layer 746b, and an upper layer 726c of the internal interconnect pillar has been formed over the middle layer 726b of the internal interconnect pillar. In some embodiments, each of the middle and upper wall layers 746b and 746c, as well as the middle and upper layers 726b and 726c of the internal interconnect pillar may be formed by electroplating processes. In some embodiments, the middle layers may include the same material as the lower layers, while the upper layers may be a different material, such as tin (Sn) or a tin alloy, or another suitable material. Because the interconnect layer 722 remains covered by a section of the photoresist layer 760, no additional layer will be formed over the interconnect layer 722 during an electroplating process.

Figure 7H:
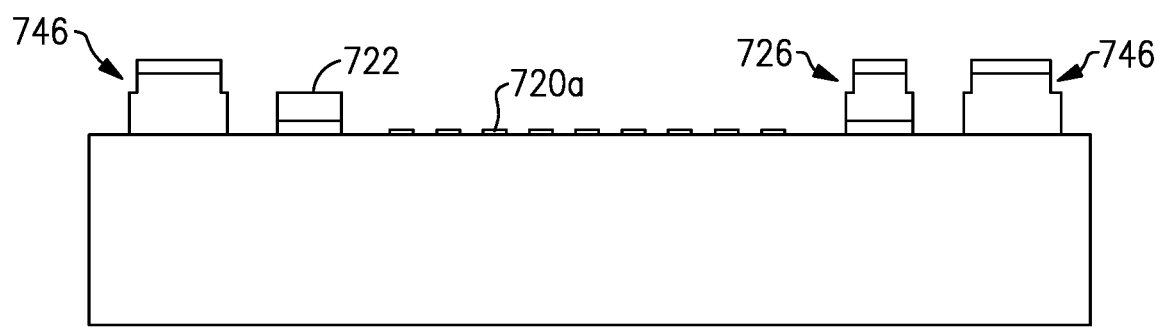

In FIG. 7H, the photoresist layers and seed layer have been removed to form a finished wafer which is ready for bonding to a second wafer to form a SAW resonator package. The wall layers form a wall 746 extending around the periphery of the SAW resonator on finished wafer. The wall 746 has a height equal to the height of the internal interconnect pillar 726. The interconnect layer 722 has a height which is less than the height of the wall 746 and the internal interconnect pillar 726.

Figure 7I:
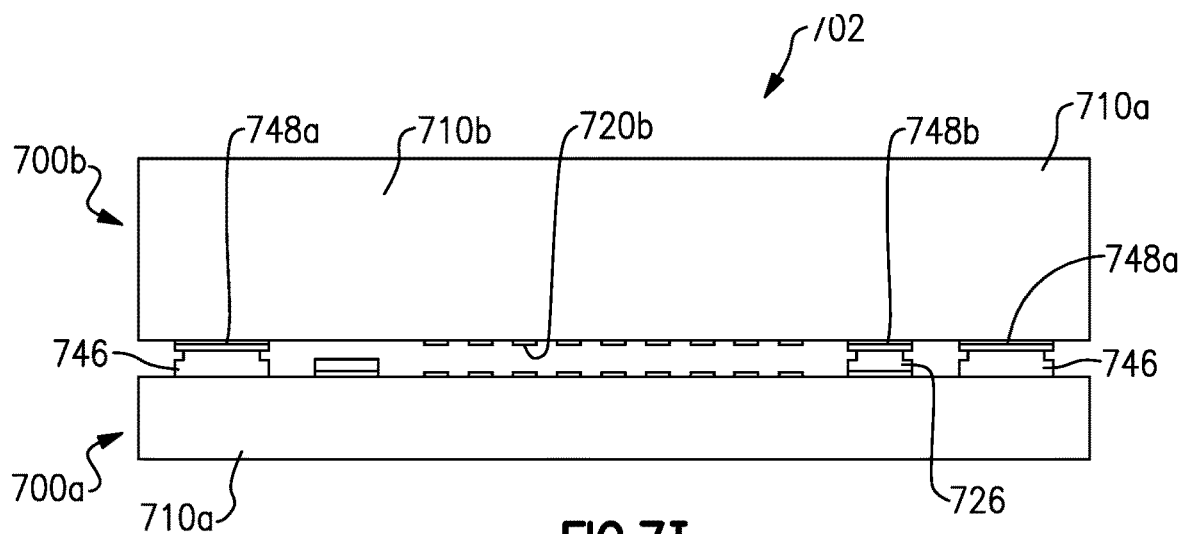

In FIG. 7I, a second SAW wafer 700b has been bonded to the first SAW wafer 700a to form a packaged acoustic wave component 702 (e.g., a stacked SAW resonator package). In the illustrated embodiment, the second SAW wafer 700b includes a piezoelectric layer 710b having a plurality of IDT electrodes 720b formed thereon. In addition, the second SAW wafer 700b has bonding pads 748a and 748b corresponding respectively to the position and locations of the wall 746 and the internal interconnect pillar 726 of the first SAW wafer 700a. In some embodiments, the bonding pads 748 include gold (Au) or a gold alloy, and can be bonded to tin layers on the upper surface of the wall 746 and the internal interconnect pillar 726. The bonding pad 748b to which the internal interconnect pillar 726 is bonded may be in electrical communication, via an interconnect or other suitable structure, with the IDT electrodes 720b of the second SAW wafer 700b.

After bonding the second SAW wafer 700b to the first SAW wafer 700a to form the packaged acoustic wave component 702, the lower surface of the first SAW wafer 700a may be ground back to reduce the thickness of the piezoelectric layer 710a to a desired thickness. In the illustrated embodiment, the piezoelectric layer 710a has been reduced to a smaller thickness than the thickness of the piezoelectric layer 710b.

Figure 7J:
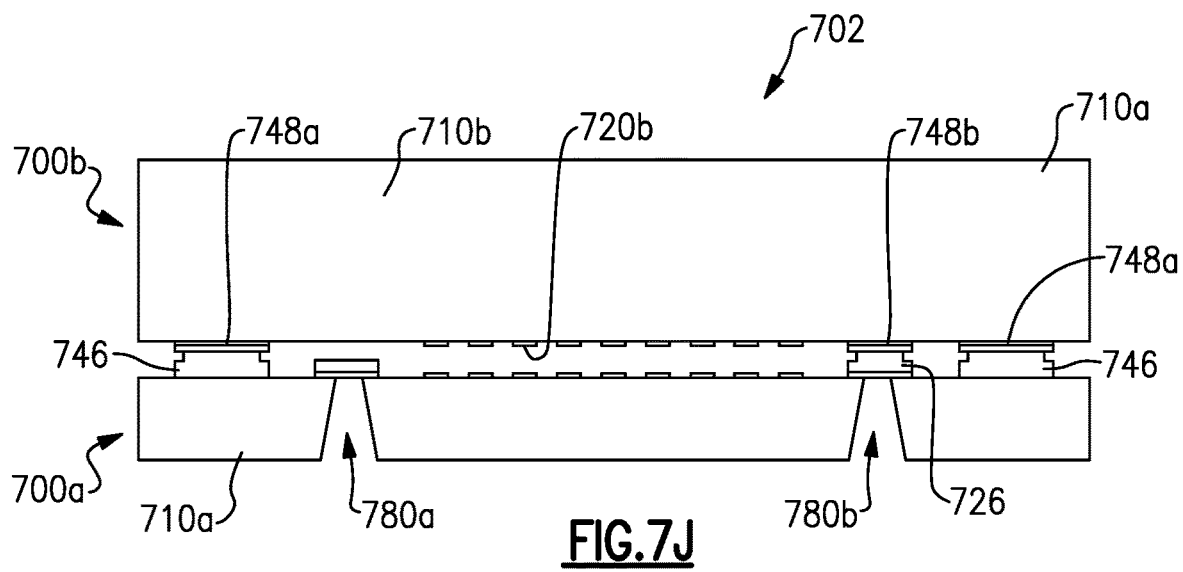

In FIG. 7J, the outer surface of the piezoelectric layer 710a has been exposed to illumination from an etching layer at least at two locations. The first location is on the opposite side of the stopper structure 728a (see FIG. 7D) at or near the base of the interconnect layer 722. A first laser-drilled via 780a has been formed at this first location, stopping on the stopper structure underlying the interconnect layer 722 to expose a portion of the stopper structure underlying interconnect layer 722. The second location is on the opposite side of the stopper structure 728b (see FIG. 7D) at or near the base of the internal interconnect pillar 726. A second laser-drilled via 780b has been formed at this location, stopping on the stopper structure of the internal interconnect pillar 726. The laser-drilled vias 780a and 780b can extend into the stopper structures of the interconnect layer 722 and the internal interconnect pillar 726, without extending into the portions of the interconnect layer 722 and the internal interconnect pillar 726 overlying the stopper structures.

Figure 7K:
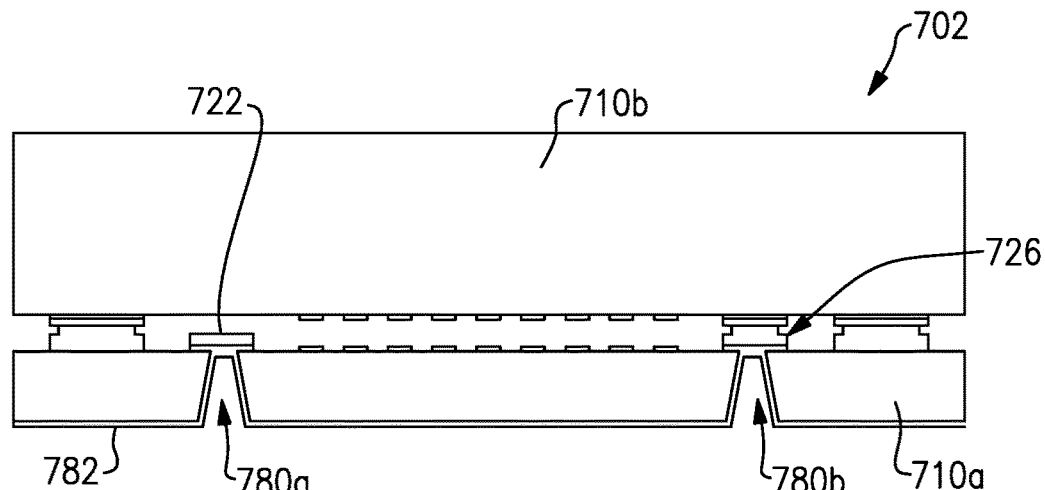

In FIG. 7K, after the formation of the laser-drilled vias 780a and 780b, a seed layer 782 has been formed over at least a portion of the outer surface of the piezoelectric layer 710a and coating the interior surfaces of the laser-drilled vias 780a and 780b and the exposed sections of the stopper structures. This seed layer 782 may be formed by sputter deposition or another suitable process.

Figure 7L:
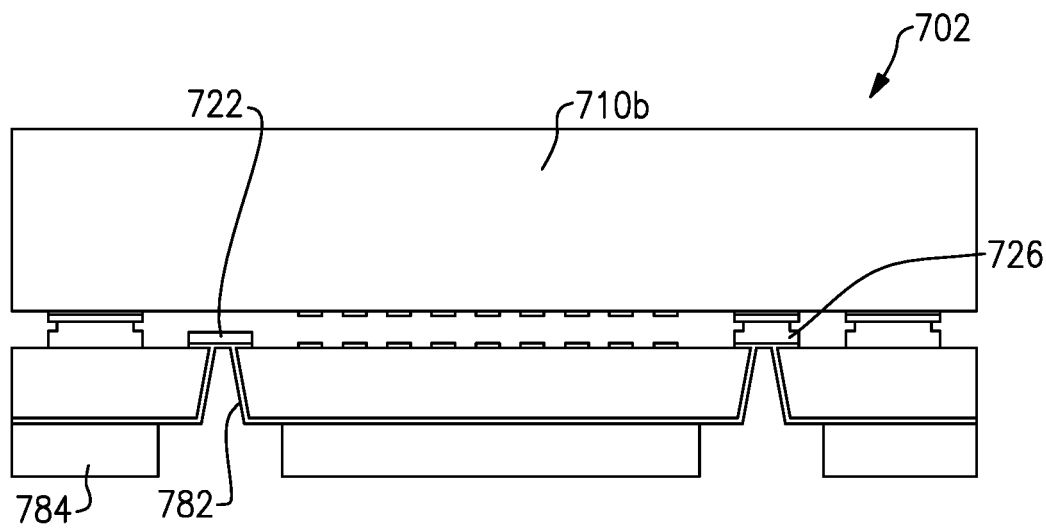

In FIG. 7L, a photoresist layer 784 has been formed over the seed layer 782, and patterned to form apertures exposing portions of the seed layer 782 covering the interior of the vias 780a and 780b and immediately adjacent the vias 780a and 780b. The size of the apertures in the photoresist layer 784 will define the size of the interconnect structures which will be formed within the photoresist layer 784. By exposing portions of the seed layer 782 adjacent the vias 780a and 780b, the interconnect structures may be made larger than the vias 780a and 780b themselves.

Figure 7M:
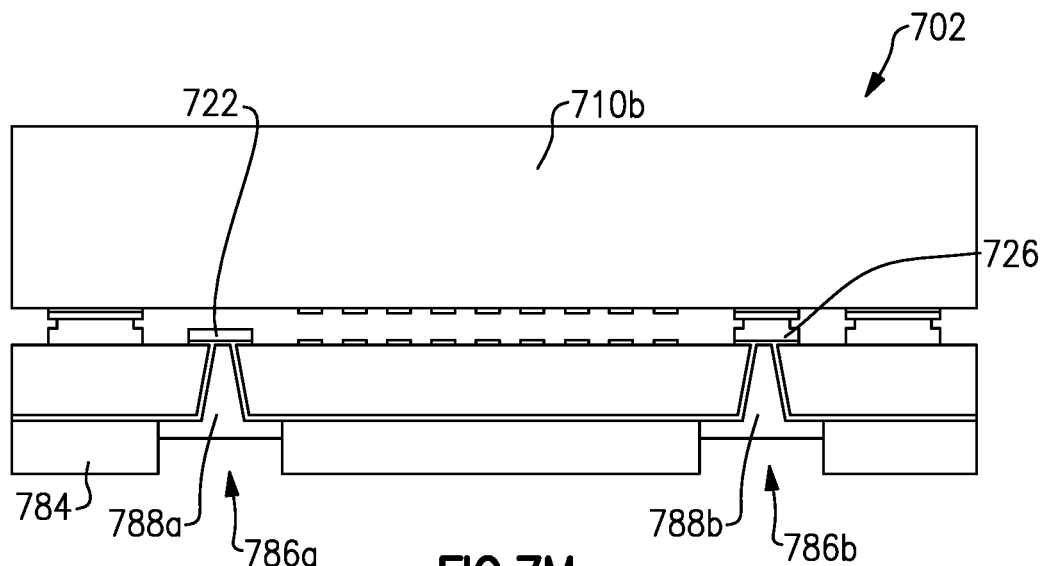

In FIG. 7M, interconnect structures 786a and 786b have been formed over the exposed portion of the seed layer 782, within the apertures formed in the photoresist layer 784. The interconnect structures 786a and 786b cover at least the respective vias 780a and 780b and the portions of the seed layer immediately surrounding the vias 780a and 780b. The interconnect structures 786a and 786b may be formed, for example, by electroplating onto the seed layer, or using any other suitable fabrication process. In some embodiments, the lower surfaces of the interconnect structures may be planarized after the electroplating process. The interconnect structures 786a and 786b may include copper or other suitable conductive materials. The interconnect structure 786a and 786b can include a conductive materials 788a and 788b disposed in the vias 780a and 780b, and the interconnect pillar 726.

Figure 7N:
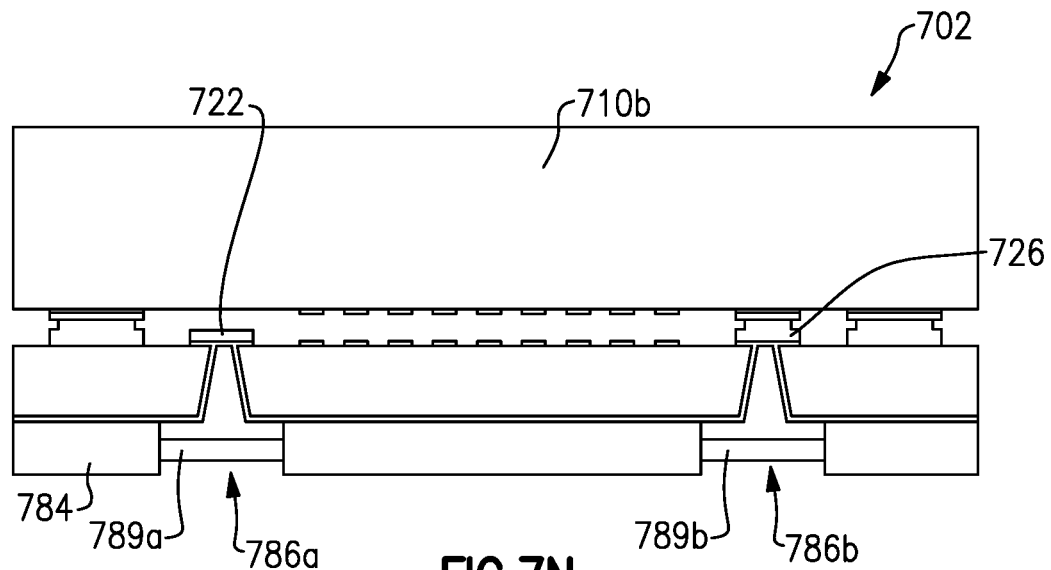

In FIG. 7N, lower layers 789*a* and 789*b* have been added to interconnect structures 786*a* and 786*b*. In such embodiments, the interconnect structures 786*a* and 786*b* can include multiple layers of materials, such as a layer of copper adjacent the seed layer, followed by lower layers 789*a* and 789*b* including tin, formed on the exposed lower surfaces of the interconnect structures. The formation of a lower layer 789*a* and 789*b* on the exposed lower surfaces of the interconnect structures 786*a* and 786*b* can facilitate bonding of the finished packages to other components.

Figure 7O:
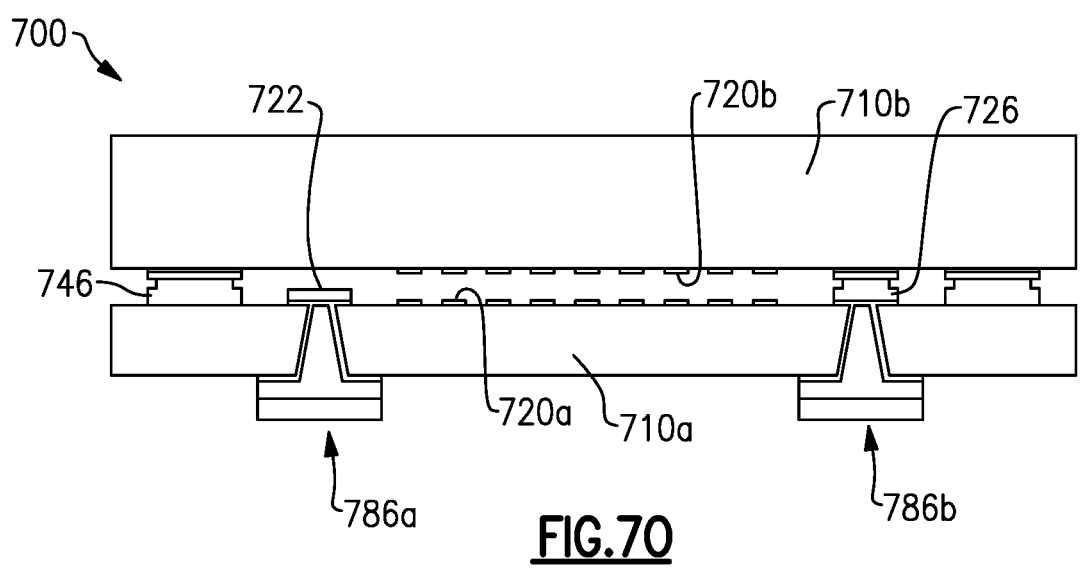

In FIG. 7O, the photoresist layer 784 and the exposed portions of the seed layer have been removed, leaving the interconnect structures 786*a* and 786*b*. A packaged acoustic wave component 700 has been formed, including IDT electrodes 720*a* and 720*b* on facing piezoelectric layers 710*a* and 710*b*. The interconnect structure 786*a* extends into the via 780*a*, and is in electrical communication with the IDT electrodes 720*a* through the interconnect layer 722 on the opposite side of the piezoelectric layer 710*a*, allowing communication with the IDT electrodes 720*a* through the piezoelectric layer 710*a*. The interconnect structure 786*b* extends into the via 780*b*, and is in electrical communication with the IDT electrodes 720*b* through the internal interconnect pillar 726 on the opposite side of the piezoelectric layer 710*a*, allowing communication with the IDT electrodes 720*b* through the same piezoelectric layer 710*a*, rather than through the piezoelectric layer 710*b* supporting the IDT electrodes 720*b*.

FIG. 8 is a schematic diagram of an example transmit filter 800 that includes surface acoustic wave resonators of a surface acoustic wave component according to an embodiment. The transmit filter 800 can be a band pass filter. The illustrated transmit filter 800 is arranged to filter a radio frequency signal received at a transmit port TX and provide a filtered output signal to an antenna port ANT. Some or all of the SAW resonators TS1 to TS7 and/or TP1 to TP5 can be SAW resonators in communication with a conductive structure extending through a laser-drilled via in accordance with any suitable principles and advantages disclosed herein. In addition, two or more of the SAW resonators of the transmit filter 800 can be in a stacked resonator package such as the packaged acoustic wave component 700 of FIG. 7J. Alternatively or additionally, one or more of the SAW resonators of the transmit filter 800 can be any surface acoustic wave resonator disclosed herein, or part of a stacked resonator package disclosed herein. Any suitable number of series SAW resonators and shunt SAW resonators can be included in a transmit filter 800.

FIG. 9 is a schematic diagram of a receive filter 900 that includes surface acoustic wave resonators of a surface acoustic wave component according to an embodiment. The receive filter 900 can be a band pass filter. The illustrated receive filter 900 is arranged to filter a radio frequency signal received at an antenna port ANT and provide a filtered output signal to a receive port RX. Some or all of the SAW resonators RS1 to RS8 and/or RP1 to RP6 can be SAW resonators in communication with a conductive structure extending through a laser-drilled via in accordance with any suitable principles and advantages disclosed herein. In addition, two or more of the SAW resonators of the receive filter 900 can be in a stacked resonator package such as the packaged acoustic wave component 700 of FIG. 7J. Alternatively or additionally, one or more of the SAW resonators of the receive filter 900 can be any surface acoustic wave resonator disclosed herein, or part of a stacked resonator package disclosed herein. Any suitable number of series SAW resonators and shunt SAW resonators can be included in a receive filter 950.

Figure 10:
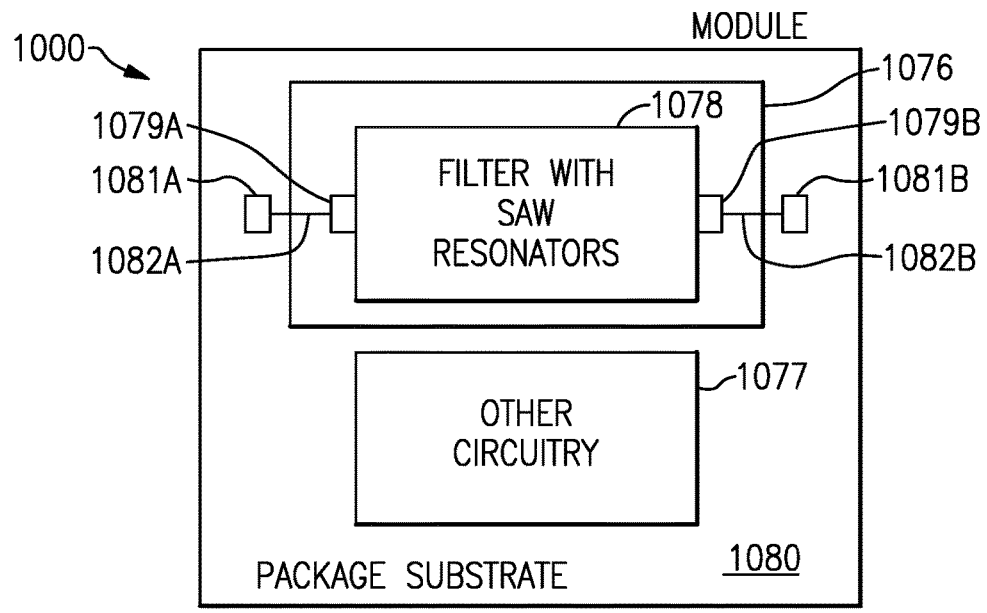
FIG. 10 is a schematic diagram of a radio frequency module that includes a surface acoustic wave component according to an embodiment.

FIG. 10 is a schematic diagram of a radio frequency module 1000 that includes a surface acoustic wave component 1076 according to an embodiment. The illustrated radio frequency module 1000 includes the SAW component 1076 and other circuitry 1077. The SAW component 1076 can include one or more SAW resonators with any suitable combination of features of the SAW resonators disclosed herein. The SAW component 1076 can include a SAW die that includes SAW resonators.

The SAW component 1076 shown in FIG. 10 includes a filter 1078 and terminals 1079A and 1079B. The filter 1078 includes SAW resonators. One or more of the SAW resonators can be SAW resonators in communication with a conductive structure extending through a laser-drilled via in accordance with any suitable principles and advantages disclosed herein. In addition, two or more of the SAW resonators of the filter 1078 can be in a stacked resonator package such as the packaged acoustic wave component 700 of FIG. 7J. The terminals 1079A and 1078B can serve, for example, as an input contact and an output contact, and may be in electrical communication with a conductive structure extending through a laser-drilled via. The SAW component 1076 and the other circuitry 1077 are on or positioned over a common packaging substrate 1080 in FIG. 10. The package substrate 1080 can be a laminate substrate. The terminals 1079A and 1079B can be electrically connected to contacts 1081A and 1081B, respectively, on or positioned over the packaging substrate 1080 by way of electrical connectors 1082A and 1082B, respectively. The electrical connectors 1082A and 1082B can be bumps or wire bonds, for example. The other circuitry 1077 can include any suitable additional circuitry. For example, the other circuitry can include one or more one or more power amplifiers, one or more radio frequency switches, one or more additional filters, one or more low noise amplifiers, the like, or any suitable combination thereof. The radio frequency module 1000 can include one or more packaging structures to, for example, provide protection and/or facilitate easier handling of the radio frequency module 1000. Such a packaging structure can include an overmold structure formed over the packaging substrate 1080. The overmold structure can encapsulate some or all of the components of the radio frequency module 1000.

Figure 11:
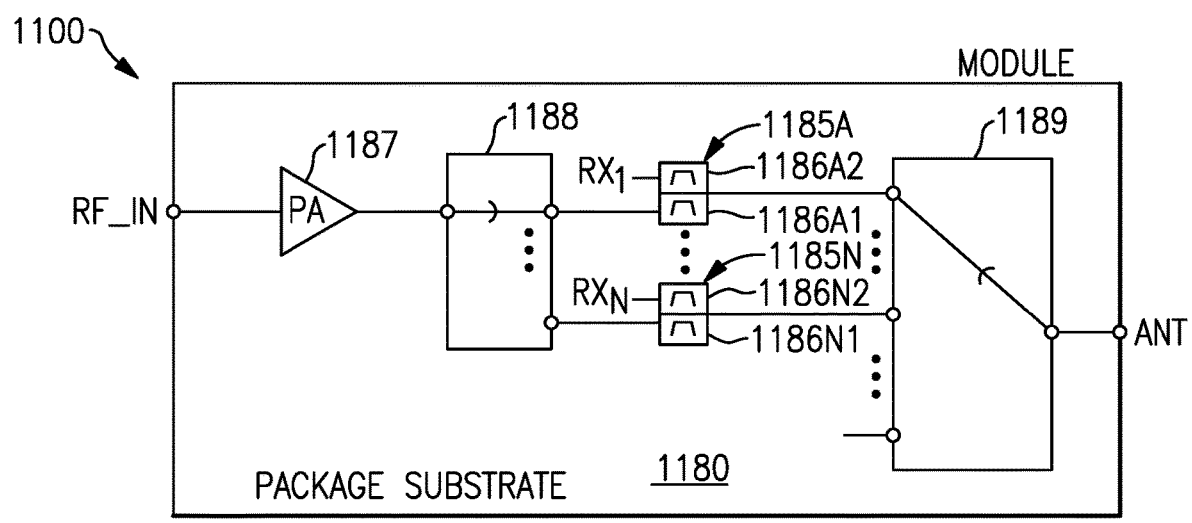
FIG. 11 is a schematic diagram of a radio frequency module that includes duplexers with surface acoustic wave resonators according to an embodiment.

FIG. 11 is a schematic diagram of a radio frequency module 1100 that includes a surface acoustic wave component according to an embodiment. As illustrated, the radio frequency module 1100 includes duplexers 1185A to 1185N that include respective transmit filters 1186A1 to 1186N1 and respective receive filters 1186A2 to 1186N2, a power amplifier 1187, a select switch 1188, and an antenna switch 1189. The radio frequency module 1100 can include a package that encloses the illustrated elements. The illustrated elements can be disposed on a common packaging substrate 1180. The packaging substrate can be a laminate substrate, for example.

The duplexers 1185A to 1185N can each include two acoustic wave filters coupled to a common node. The two acoustic wave filters can be a transmit filter and a receive filter. As illustrated, the transmit filter and the receive filter can each be band pass filters arranged to filter a radio frequency signal. One or more of the transmit filters 1186A1 to 1186N1 can include one or more SAW resonators in accordance with any suitable principles and advantages disclosed herein. Similarly, one or more of the receive filters 1186A2 to 1186N2 can include one or more SAW resonators in accordance with any suitable principles and advantages disclosed herein. Although FIG. 12 illustrates duplexers, any suitable principles and advantages disclosed herein can be implemented in other multiplexers (e.g., quadplexers, hexaplexers, octoplexers, etc.) and/or in switch-plexers.

The power amplifier 1187 can amplify a radio frequency signal. The illustrated switch 1188 is a multi-throw radio frequency switch. The switch 1188 can electrically couple an output of the power amplifier 1187 to a selected transmit filter of the transmit filters 1186A1 to 1186N1. In some instances, the switch 1188 can electrically connect the output of the power amplifier 1187 to more than one of the transmit filters 1186A1 to 1186N1. The antenna switch 1189 can selectively couple a signal from one or more of the duplexers 1185A to 1185N to an antenna port ANT. The duplexers 1185A to 1185N can be associated with different frequency bands and/or different modes of operation (e.g., different power modes, different signaling modes, etc.).

Figure 12:
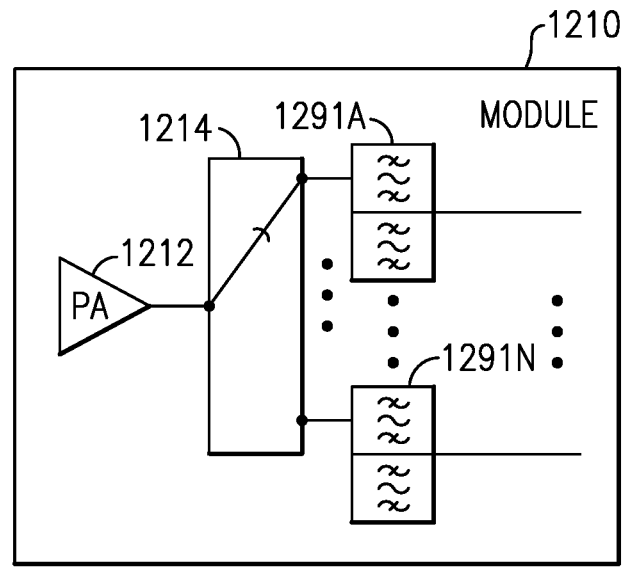
FIG. 12 is a schematic block diagram of a module that includes a power amplifier, a radio frequency switch, and duplexers that include one or more surface acoustic wave resonators according to an embodiment.

FIG. 12 is a schematic block diagram of a module 1210 that includes a power amplifier 1292, a radio frequency switch 1293, and duplexers 1291A to 1291N in accordance with one or more embodiments. The power amplifier 1292 can amplify a radio frequency signal. The radio frequency switch 1293 can be a multi-throw radio frequency switch. The radio frequency switch 1293 can electrically couple an output of the power amplifier 1292 to a selected transmit filter of the duplexers 1291A to 1291N. One or more filters of the duplexers 1291A to 1291N can include any suitable number of surface acoustic wave resonators in communication with a conductive structure extending through a laser-drilled via, or as part of a stacked resonator package, in accordance with any suitable principles and advantages discussed herein. Any suitable number of duplexers 1291A to 1291N can be implemented.

Figure 13:
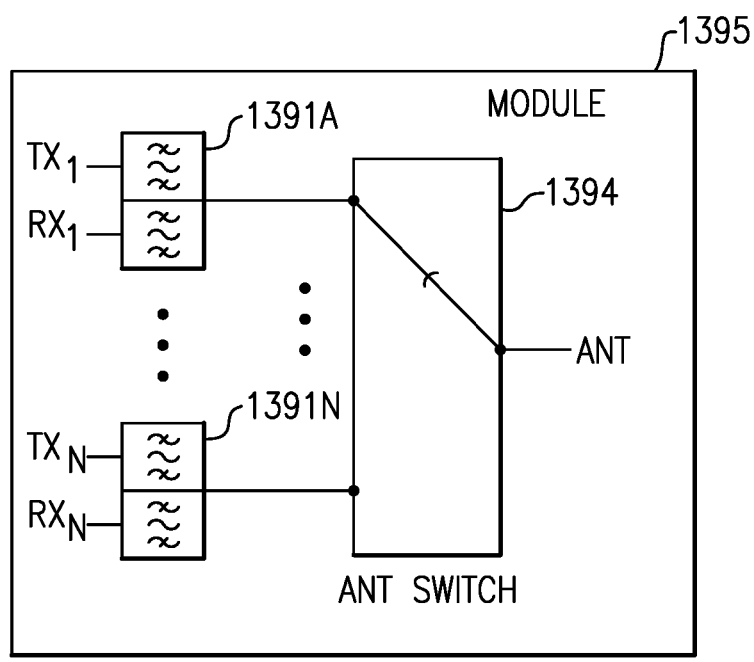
FIG. 13 is a schematic block diagram of a module that includes an antenna switch and duplexers that include one or more surface acoustic wave resonators according to an embodiment.

FIG. 13 is a schematic block diagram of a module 1395 that includes duplexers 1391A to 1391N and an antenna switch 1394. One or more filters of the duplexers 1391A to 1391N can include any suitable number of surface acoustic wave resonators in communication with a conductive structure extending through a laser-drilled via, or as part of a stacked resonator package, in accordance with any suitable principles and advantages discussed herein. Any suitable number of duplexers 1391A to 1391N can be implemented. The antenna switch 1394 can have a number of throws corresponding to the number of duplexers 1391A to 1391N. The antenna switch 1394 can electrically couple a selected duplexer to an antenna port of the module 1395.

Figure 14:
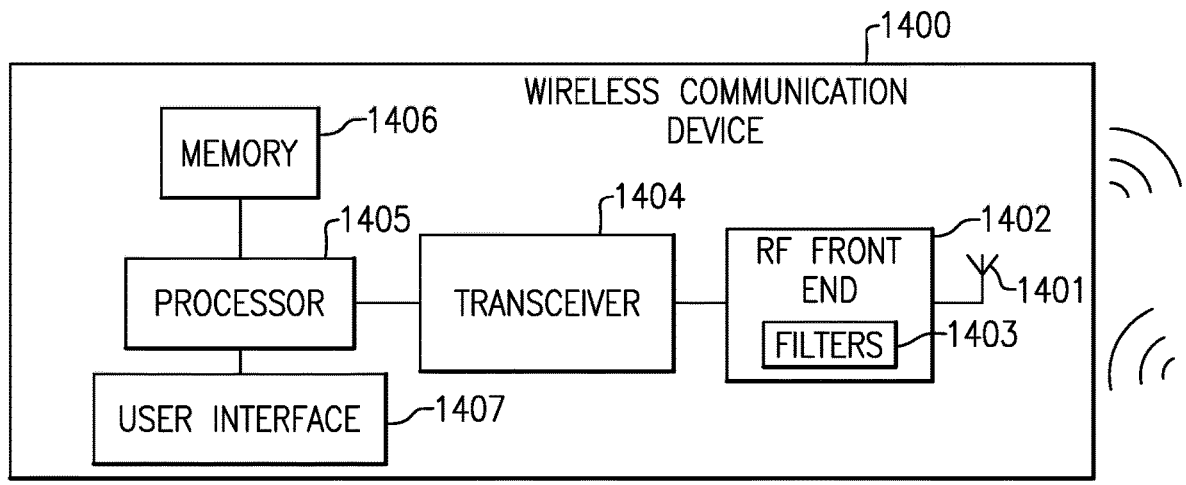
FIG. 14 is a schematic block diagram of a wireless communication device that includes a filter in accordance with one or more embodiments.

FIG. 14 is a schematic diagram of a wireless communication device 1400 that includes filters 1403 in a radio frequency front end 1402 according to an embodiment. The filters 1403 can include one or more SAW resonators in accordance with any suitable principles and advantages discussed herein. The wireless communication device 1400 can be any suitable wireless communication device. For instance, a wireless communication device 1400 can be a mobile phone, such as a smart phone. As illustrated, the wireless communication device 1400 includes an antenna 1401, an RF front end 1402, a transceiver 1404, a processor 1405, a memory 1406, and a user interface 1407. The antenna 1401 can transmit RF signals provided by the RF front end 1402. Such RF signals can include carrier aggregation signals. Although not illustrated, the wireless communication device 1400 can include a microphone and a speaker in certain applications.

The RF front end 1402 can include one or more power amplifiers, one or more low noise amplifiers, one or more RF switches, one or more receive filters, one or more transmit filters, one or more duplex filters, one or more multiplexers, one or more frequency multiplexing circuits, the like, or any suitable combination thereof. The RF front end 1402 can transmit and receive RF signals associated with any suitable communication standards. The filters 1403 can include SAW resonators of a SAW component that includes any suitable combination of features discussed with reference to any embodiments discussed above.

The transceiver 1404 can provide RF signals to the RF front end 1402 for amplification and/or other processing. The transceiver 1404 can also process an RF signal provided by a low noise amplifier of the RF front end 1402. The transceiver 1404 is in communication with the processor 1405. The processor 1405 can be a baseband processor. The processor 1405 can provide any suitable base band processing functions for the wireless communication device 1400. The memory 1406 can be accessed by the processor 1405. The memory 1406 can store any suitable data for the wireless communication device 1400. The user interface 1407 can be any suitable user interface, such as a display with touch screen capabilities.

Figure 15:
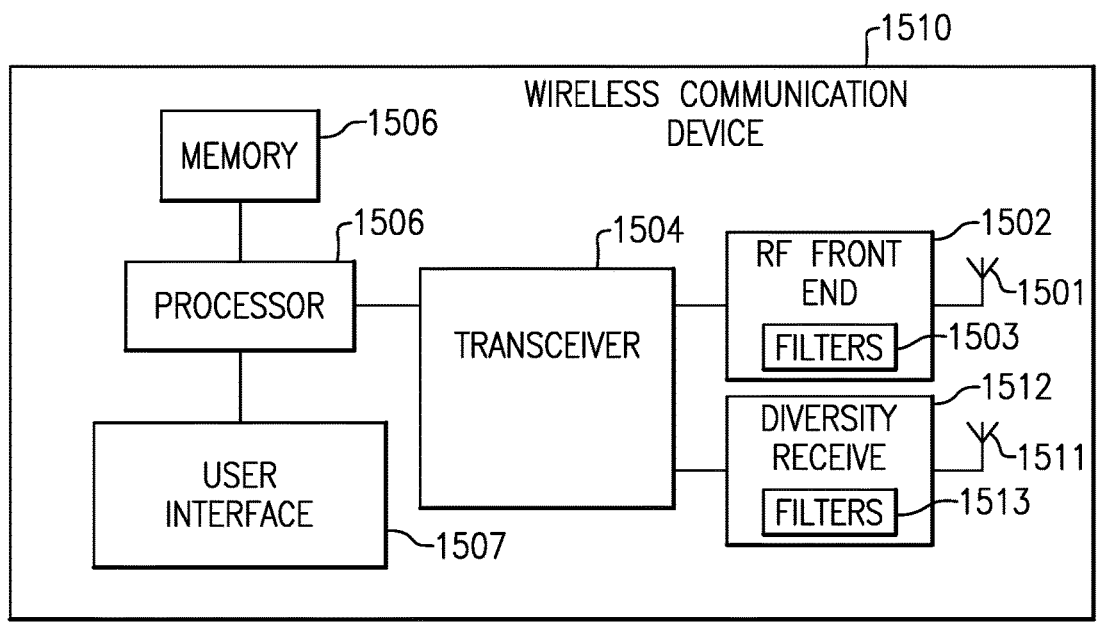
FIG. 15 is a schematic block diagram of another wireless communication device that includes a filter in accordance with one or more embodiments.

FIG. 15 is a schematic diagram of a wireless communication device 1510 that includes filters 1503 in a radio frequency front end 1502 and second filters 1513 in a diversity receive module 1512. The wireless communication device 1510 is like the wireless communication device 1500 of FIG. 14, except that the wireless communication device 1520 also includes diversity receive features. As illustrated in FIG. 15, the wireless communication device 1520 includes a diversity antenna 1511, a diversity module 1512 configured to process signals received by the diversity antenna 1511 and including filters 1513, and a transceiver 1504 in communication with both the radio frequency front end 1502 and the diversity receive module 1512. The filters 1513 can include one or more SAW resonators that include any suitable combination of features discussed with reference to any embodiments discussed above.

Although embodiments disclosed herein relate to surface acoustic wave resonators, any suitable principles and advantages disclosed herein can be applied to other types of acoustic wave resonators, such as Lamb wave resonators and/or boundary wave resonators. For example, any resonator including a substrate suitable for etching by lasers can have a laser-drilled via formed therethrough, using a stopper layer or stopper structure which is highly reflective to the wavelength of the etching laser. These vias can be used to provide communication with the resonator into a package enclosing the resonator, where the substrate through which the via is laser-drilled is used to form part of the package enclosing the resonator.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

An acoustic wave resonator including any suitable combination of features disclosed herein can be included in a filter arranged to filter a radio frequency signal in a fifth generation (5G) New Radio (NR) operating band within Frequency Range 1 (FR1). A filter arranged to filter a radio frequency signal in a 5G NR operating band can include one or more acoustic wave resonators disclosed herein. FR1 can be from 410 MHz to 7.125 GHz, for example, as specified in a current 5G NR specification. One or more acoustic wave resonators in accordance with any suitable principles and advantages disclosed herein can be included in a filter arranged to filter a radio frequency signal in a fourth generation (4G) Long Term Evolution (LTE) operating band and/or in a filter with a passband that spans a 4G LTE operating band and a 5G NR operating band.

Aspects of this disclosure can be implemented in various electronic devices. Examples of the electronic devices can include, but are not limited to, consumer electronic products, parts of the consumer electronic products such as die and/or acoustic wave components and/or acoustic wave filter assemblies and/or packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A packaged acoustic wave component comprising: a first acoustic wave resonator including a first interdigital transducer electrode positioned over a first piezoelectric layer; a second acoustic wave resonator including a second interdigital transducer electrode positioned over a second piezoelectric layer, the second piezoelectric layer being bonded to the first piezoelectric layer; and a stopper structure positioned over the first piezoelectric layer, the stopper structure positioned above a via extending through the first piezoelectric layer, the stopper structure in electrical communication with the first interdigital transducer electrode and including a material which reflects at least fifty percent of light having a wavelength of 355 nanometers, the via being a laser drilled via; the laser-drilled via further extends at least partially through the stopper structure.

2. The packaged acoustic wave component of claim 1 further comprising a second stopper structure positioned over the first piezoelectric layer, the second stopper structure positioned over a second laser-drilled via extending through the first piezoelectric layer, the second stopper structure in electrical communication with the second interdigital transducer electrode.

3. The packaged acoustic wave component of claim 2 wherein the second stopper structure includes a material which reflects at least fifty percent of light having a wavelength of 355 nanometers.

4. The packaged acoustic wave component of claim 2 further comprising an interconnect layer in electrical communication with the first interdigital transducer electrode and the stopper structure, the interconnect layer positioned over at least a portion of the stopper structure.

5. The packaged acoustic wave component of claim 2 further comprising an interconnect structure extending between the first piezoelectric layer and the second piezoelectric layer, the interconnect structure in electrical communication with the second interdigital transducer electrode and the second stopper structure, wherein the interconnect structure is positioned over at least a portion of the second stopper structure.

6. The packaged acoustic wave component of claim 2 further comprising a wall surrounding a region including the first and second acoustic wave resonators, the wall bonding the first piezoelectric layer to the second piezoelectric layer to form a package structure, wherein at least one of the stopper structure or the second stopper structure is located within the region surrounded by the wall.

7. The packaged acoustic wave component of claim 2 wherein at least one of the stopper structure or second stopper structure includes a material which reflects at least seventy-five percent reflective of light having a wavelength of 355 nanometers.

8. The packaged acoustic wave component of claim 2 wherein at least one of the stopper structure or second stopper structure is an aluminum layer.

9. The packaged acoustic wave component of claim 2 wherein at least one of the stopper structure or second stopper structure has a thickness of less than 5 micrometers.

10. The packaged acoustic wave component of claim 1 wherein the first and second piezoelectric layers are lithium tantalate layers, or lithium niobate layers.

11. A packaged acoustic wave component comprising:
a first acoustic wave resonator including a first interdigital transducer electrode positioned over a first piezoelectric layer;
a second acoustic wave resonator including a second interdigital transducer electrode positioned over a second piezoelectric layer, the second piezoelectric layer being bonded to the first piezoelectric to form a package encapsulating the first and second interdigital transducer electrodes; and
a stopper structure positioned over the first piezoelectric layer, the stopper structure positioned over a via extending through the first piezoelectric layer, the stopper structure including aluminum, the stopper structure having an ablated or melted portion on a side of the stopper structure that faces the via.

12. The packaged acoustic wave component of claim 11 wherein the via is a laser-drilled via.

13. The packaged acoustic wave component of claim 11 further comprising a first conductive structure extending into the via, the first conductive structure in electrical communication with the first interdigital transducer electrode.

14. The packaged acoustic wave component of claim 11 further comprising a second stopper structure positioned over the first piezoelectric layer, the second stopper structure positioned over a second laser-drilled via extending through the first piezoelectric layer, the stopper structure and second stopper structure including aluminum.

15. The packaged acoustic wave component of claim 14 further comprising a second conductive structure extending into the second via, the second conductive structure in electrical communication with the second interdigital transducer electrode.

16. The packaged acoustic wave component of claim 11 further comprising an interconnect layer in electrical communication with the first interdigital transducer electrode and the stopper structure, the interconnect layer positioned over at least a portion of the stopper structure.

17. The packaged acoustic wave component of claim 11 wherein the stopper structure has a thickness of less than 5 micrometers.

18. The packaged acoustic wave component of claim 11 wherein an overall thickness of the package is less than 200 micrometers.

19. The packaged acoustic wave component of claim 11 wherein the first acoustic wave resonator is associated with a first frequency band, and the second acoustic wave resonator is associated with a second frequency band, wherein the first frequency band is different than the second frequency band.

* * * * *